(12) United States Patent
Murakami et al.

(10) Patent No.: US 8,319,330 B2
(45) Date of Patent: Nov. 27, 2012

(54) SEMICONDUCTOR PACKAGE HAVING EXTERIOR PLATING FILMS FORMED OVER SURFACES OF OUTER LEADS

(75) Inventors: Tomohiro Murakami, Kanagawa (JP); Takahiko Kato, Hitachinaka (JP); Masato Nakamura, Hitachinaka (JP); Takeshi Terasaki, Hitachinaka (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/181,856

(22) Filed: Jul. 13, 2011

(65) Prior Publication Data
US 2012/0012992 A1  Jan. 19, 2012

(30) Foreign Application Priority Data
Jul. 16, 2010 (JP) .................................. 2010-161699

(51) Int. Cl.
*H01L 23/22* (2006.01)
*H01L 23/24* (2006.01)
*H01L 23/48* (2006.01)

(52) U.S. Cl. ........ 257/687; 257/693; 257/730; 257/739; 257/E23.011; 257/E23.041

(58) Field of Classification Search .................. 257/687, 257/693, 730, 739, E23.011, E23.041
See application file for complete search history.

(56) References Cited

U.S. PATENT DOCUMENTS

| 6,593,643 | B1 * | 7/2003 | Seki et al. ...................... 257/677 |
| 6,815,255 | B2 * | 11/2004 | Nakaoka et al. .............. 438/108 |
| 2003/0032216 | A1 * | 2/2003 | Nakaoka et al. .............. 438/106 |
| 2009/0014855 | A1 | 1/2009 | Miyaki et al. |
| 2009/0051049 | A1 * | 2/2009 | Kasuya et al. ................ 257/782 |

FOREIGN PATENT DOCUMENTS

JP   2006-352175   12/2006

* cited by examiner

*Primary Examiner* — Ngan Ngo
(74) *Attorney, Agent, or Firm* — McDermott Will & Emery LLP

(57) ABSTRACT

A semiconductor device having an improved whisker resistance in an exterior plating film is disclosed. The semiconductor device includes a tab with a semiconductor chip fixed thereto, plural inner leads, plural outer leads formed integrally with the inner leads, a plurality of wires for coupling electrode pads of the semiconductor chip and the inner leads with each other, and a sealing body for sealing the semiconductor chip. The outer leads project from the sealing body and an exterior plating film, which is a lead-free plating film, is formed on a surface of each of the outer leads. In the exterior plating film, the number of grains not larger than 1 μm in diameter and present on an interface side in the thickness direction of the exterior plating film is larger than the number of grains not larger than 1 μm and present on a surface side of the exterior plating film, whereby the difference in linear expansion coefficient between the exterior plating film and the outer lead is made small, thus making it possible to suppress the growth of whisker.

23 Claims, 23 Drawing Sheets

2b : OUTER LEAD
 8 : EXTERIOR PLATING FILM
8c : INTERFACE SIDE
8d : SURFACE SIDE

FIG. 16

| | PERCENT PRESENCE OF 1 μm OR SMALLER DIA. GRAINS (%) | | | | | |
|---|---|---|---|---|---|---|
| | BEFORE IMPROVEMENT | | | AFTER IMPROVEMENT | | |
| | WHOLE | SURFACE SIDE | INTERFACE SIDE | WHOLE | SURFACE SIDE | INTERFACE SIDE |
| AFTER PLATING | 40.5 | 33.7 | 45.2 | 49.8 | 39.8 | 58.9 |
| AFTER TEMPERATURE CYCLE ENVIRONMENTAL TEST | 40.2 | 14.3 | 46.4 | 48.8 | 19.4 | 45.8 |

FIG. 17

| AVERAGE SECTIONAL AREA (μm²) | | | | | |
|---|---|---|---|---|---|
| BEFORE IMPROVEMENT | | | AFTER IMPROVEMENT | | |
| ENTIRE FILM | SURFACE SIDE | INTERFACE SIDE | ENTIRE FILM | SURFACE SIDE | INTERFACE SIDE |
| 2.54 | 2.44 | 1.67 | 2.32 | 2.20 | 1.56 |

FIG. 18

| CRYSTAL ORIENTATION | LINEAR EXPANSION COEFFICIENT IN LEAD SURFACE DIRECTION | CRYSTAL ORIENTATION | LINEAR EXPANSION COEFFICIENT IN LEAD SURFACE DIRECTION |
|---|---|---|---|
| (hkl) | $\alpha_{PL}$ | (hkl) | $\alpha_{PL}$ |
| 001 | 1.580E-05 | 410 | 2.210E-05 |
| 100 | 2.210E-05 | 411 | 2.114E-05 |
| 101 | 1.684E-05 | 413 | 1.752E-05 |
| 103 | 1.684E-05 | 420 | 2.210E-05 |
| 110 | 2.210E-05 | 421 | 2.149E-05 |
| 111 | 1.797E-05 | 430 | 2.210E-05 |
| 112 | 1.649E-05 | 431 | 2.151E-05 |
| 120 | 2.210E-05 | 432 | 1.988E-05 |
| 130 | 2.210E-05 | 440 | 2.210E-05 |
| 200 | 2.210E-05 | 441 | 2.156E-05 |
| 201 | 1.823E-05 | 501 | 2.063E-05 |
| 210 | 2.210E-05 | 512 | 1.924E-05 |
| 211 | 1.936E-05 | 521 | 2.191E-05 |
| 213 | 1.653E-05 | 532 | 2.036E-05 |
| 220 | 2.210E-05 | 541 | 2.174E-05 |
| 221 | 2.023E-05 | 600 | 2.210E-05 |
| 230 | 2.210E-05 | 611 | 2.208E-05 |
| 301 | 1.932E-05 | 620 | 2.210E-05 |
| 303 | 1.684E-05 | 631 | 2.201E-05 |
| 310 | 2.210E-05 | 640 | 2.210E-05 |
| 311 | 2.039E-05 | 701 | 2.123E-05 |
| 312 | 1.797E-05 | 881 | 2.196E-05 |
| 320 | 2.210E-05 | 910 | 2.210E-05 |
| 321 | 2.095E-05 | 911 | 2.272E-05 |
| 323 | 1.747E-05 | 931 | 2.252E-05 |
| 331 | 2.116E-05 | 951 | 2.209E-05 |
| 332 | 1.932E-05 | 971 | 2.200E-05 |
| 400 | 2.210E-05 | 991 | 2.199E-05 |
| 401 | 2.010E-05 | | |

FIG. 19

| | BEFORE IMPROVEMENT | AFTER IMPROVEMENT |
|---|---|---|
| AVERAGE LINEAR EXPANSION COEFFICIENT DIFFERENCE (DIFFERENCE FROM LEAD) | 16.5ppm | 15.9ppm |

FIG. 28

|  |  | TEMPERATURE CYCLE (1000cyc) | HIGH TEMPERATURE HIGH HUMIDITY (2000hr) |
|---|---|---|---|
| Ref.(20A/dm2) | | — | — |
| SURFACE SIDE | 50A/dm2 | −35.2% | NOT FORMED |
| | 30A/dm2 | −41.0% | NOT FORMED |
| | 10A/dm2 | −18.0% | NOT FORMED |
| CENTER | 5A/dm2 | −12.4% | NOT FORMED |
| | 10A/dm2 | −48.0% | NOT FORMED |
| INTERFACE SIDE | 50A/dm2 | −56.0% | NOT FORMED |
| | 30A/dm2 | −65.0% | NOT FORMED |
| | 25A/dm2 | −71.5% | NOT FORMED |
| | 15A/dm2 | −65.8% | NOT FORMED |
| | 10A/dm2 | −69.4% | NOT FORMED |
| | 5A/dm2 | −53.9% | NOT FORMED |
| | 20A/dm2 (Chopper RATIO CHANGED) | −51.4% | NOT FORMED |

SEMICONDUCTOR PACKAGE HAVING EXTERIOR PLATING FILMS FORMED OVER SURFACES OF OUTER LEADS

CROSS REFERENCE TO RELATED APPLICATIONS

The disclosure of Japanese Patent Application No. 2010-161699 filed on Jul. 16, 2010 including the application, drawings and abstract is incorporated herein by reference in its entirety.

BACKGROUND

The present invention relates to a semiconductor device technique and particularly to a technique applicable effectively to the improvement in whisker resistance of lead-free plating.

In connection with a semiconductor integrated circuit device there is known a structure in which an alloy layer higher in melting point than tin-lead eutectic solder and not containing lead as a principal constituent metal is formed in a portion outside a resin-sealed portion (see, for example, Patent Document 1).

Recently, with consideration for environment, the use of lead has been diminished and the application of lead-free plating has been increasing. Lead-free plating has come to be used widely as surface treatment for external terminals in semiconductor devices, etc.

In lead-free plating, however, there exists a problem of growth of tin whisker as a latent problem. The occurrence of tin whisker is a natural phenomenon difficult to suppress and is presumed to be caused by natural standing, temperature cycle, or corrosion in a high-temperature high-humidity environment. Particularly, the whisker based on temperature cycle occurs in common in case of tin being contained irrespective of the type of plating.

There are various causes of tin whisker occurrence, but it is presumed that tin whisker is caused by the application of a compressive stress to a plating film, resulting in the plating film being pushed out. Most of the measures for remedying tin whisker are such countermeasures as baking and reflowing, with no effective remedial measure having been found out in exterior treatment.

On the other hand, against whisker caused by fitting of a connector product or the like, plural-layer plating using different kinds of metals or plural-layer plating using different types of platings has been proposed as one of remedial measures.

The present invention has been studied and accomplished under the technical background of suppressing and remedying the growth of tin whisker in lead-free plating which whisker growth has heretofore been a latent problem as mentioned above.

RELATED ART DOCUMENT

[Patent Document 1]
Japanese Unexamined Patent Publication No. 2006-352175

SUMMARY

A process of assembling a semiconductor device using a lead frame mainly includes a die bonding step of mounting a semiconductor chip onto a die pad of the lead frame, a wire bonding step of coupling electrode pads of the semiconductor chip and inner leads with each other electrically, a packaging (sealing) step of sealing the semiconductor chip and wires, and a dividing step into individual pieces by cutting off outer leads from the lead frame.

Further, after the packaging step and before the dividing step into individual pieces there is an exterior plating step for each of the outer leads. In the exterior plating step, an exterior plating film is formed on each of the outer leads exposed from a sealing body in order to mount the semiconductor device onto a package substrate such as a printed circuit board.

As the exterior plating, lead-free plating is used in many cases because it is required to take an appropriate measure against the environmental problem as mentioned above. For example, tin-copper, tin-bismuth, tin-silver, and pure tin, are used frequently as the materials of lead-free plating.

However, if a temperature cycle test is conducted in testing a semiconductor device, a metallic whisker-like crystal product called whisker as referred to above may be formed on the outer lead surface.

It is presumed that whisker is formed by the following mechanism in the temperature cycle test. A base material (e.g., iron-nickel alloy) of each outer lead and lead-free plating (e.g., tin-copper plating) are different in linear expansion coefficient, so that strain is induced by heat shrinkage of the two in temperature cycle. The strain accumulates gradually in the lead-free plating and the thus-accumulated strain projects as whisker to the exterior. The whisker caused by temperature cycle is conspicuous in the case of iron-nickel alloy material and lead-free plating because of a large difference in linear expansion coefficient between the two. However, also in the case of copper alloy material and lead-free plating, it is presumed that there exists a whisker growth potential, because there is a difference in linear expansion coefficient between the two although it is small.

FIGS. 31 and 32 are diagrams showing principles of whisker occurrence which the present inventors have studied. A general precipitation mode in exterior plating is shown schematically in both figures.

In exterior plating, as shown in FIG. 31, crystals 52 (grains) small in grain diameter and having orientation in (111) orientation direction 50 are precipitated onto a frame material 54 such as, for example, an outer lead. Over the crystals 52 there occurs precipitation of crystals 53 (grains) larger in grain size by geometrical growth as shown in FIG. 32, which precipitation occurs along the initially precipitated crystals 52 having the (111) orientation direction 50. In the crystals 53 (grains) of such an orientation, a crystal C-axis faces in a horizontal direction (C-axis direction 51) with respect to the frame material 54, thus resulting in the grains being greatly different in linear expansion coefficient from the frame material 54. Such large grains lead to formation of whisker.

Once whisker is formed on outer leads in a semiconductor device under the above-mentioned principles, the semiconductor device undergoes an electric short, which causes malfunction of the semiconductor device. This problem remains to be solved.

The present invention has been accomplished in view of the above-mentioned problem and it is an object of the invention to provide a technique capable of improving whisker resistance.

The above and other objects and novel features of the present invention will become apparent from the following description and the accompanying drawings.

The following is a brief description of a typical mode of the present invention as disclosed herein.

According to a typical mode of the present invention there is provided a semiconductor device. The semiconductor device includes a semiconductor chip having plural surface electrodes, a die pad with the semiconductor chip mounted thereon, plural inner leads arranged around the semiconductor chip, plural wires for coupling the surface electrodes of the semiconductor chip and the inner leads with each other electrically, a sealing body for sealing the semiconductor chip, the inner leads and the wires, plural outer leads integrally coupled to the inner leads respectively and exposed from the sealing body, and exterior plating films formed over surfaces of the outer leads respectively. In the semiconductor device, the exterior plating films are each formed so that the number of grains not larger than 1 µm in diameter and present on an interface side closer to the corresponding lead with respect to a center in the thickness direction of the exterior plating film is larger than the number of grains not larger than 1 µm in diameter and present on a surface side of the exterior plating film.

The following is a brief description of an effect obtained by the typical mode of the present invention as disclosed herein.

In the exterior plating film formed on each outer lead, a compressive stress induced by the difference in linear expansion coefficient between the lead and the exterior plating film is diminished to make accumulation of the compressive stress on the plating film difficult, thereby suppressing the growth of whisker. Consequently, it is possible to improve the whisker resistance in the exterior plating film.

BRIEF DESCRIPTION OF THE DRAWINGS

FIG. 16 is a data diagram showing grain diameter distributions in the exterior plating film before and after improvement shown in FIGS. 12 and 13;

FIG. 17 is a data diagram showing average sectional areas of all grains in the exterior plating film before and after improvement shown in FIGS. 14 and 15;

FIG. 18 is a data diagram showing an example of linear expansion coefficients crystal orientation by crystal orientation in the exterior plating film;

FIG. 19 is a data diagram showing mean values with respect to the difference in linear expansion coefficient between the exterior plating film and the lead before and after improvement;

FIG. 28 is a data diagram showing a whisker suppressing effect in the exterior plating film after improvement (the embodiment) in FIG. 11;

DETAILED DESCRIPTION

Figure 1:
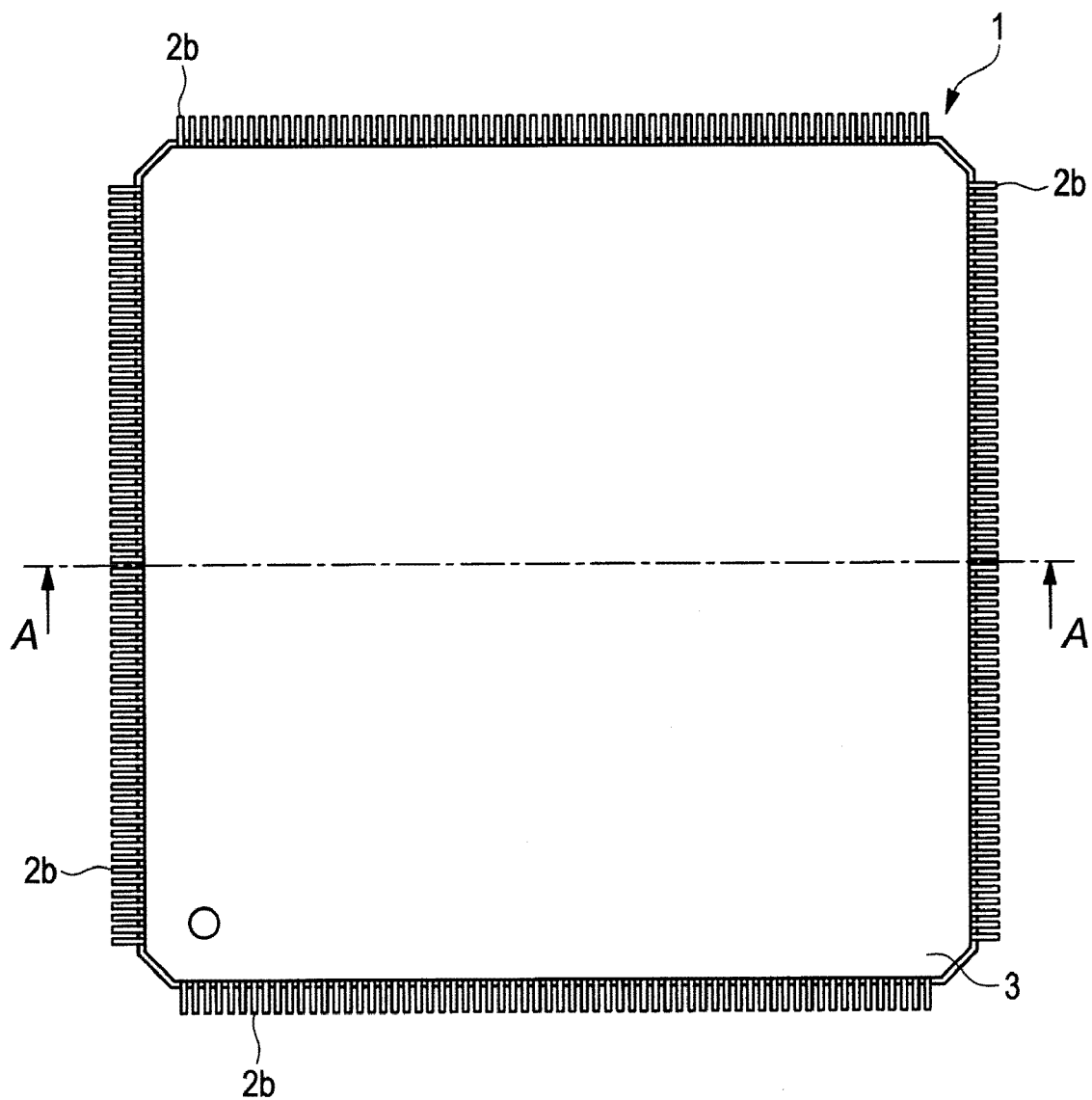
FIG. 1 is a plan view showing a structural example of a semiconductor device assembled by a method for manufacturing a semiconductor device according to an embodiment of the present invention.

In the following embodiment, explanations of the same or similar portions will not be repeated in principle except the case where such explanations are specially needed.

Where required for the convenience' sake, the following embodiment will be described dividedly into plural sections of embodiments, but unless otherwise specified, they are not unrelated to each other, but are in a relation such that one is a modification or a detailed or supplementary explanation of part or the whole of the other.

In the following embodiment, when reference is made to the number of elements (including the number, numerical value, quantity and range), no limitation is made to the number referred to, but numerals above and below the number referred to will do as well unless otherwise specified and except the case it is basically evident that limitation is made to the number referred to.

It goes without saying that in the following embodiment its constituent elements (including constituent steps) are not always essential unless otherwise specified and except the case where they are considered essential basically obviously.

Likewise, it goes without saying that the expressions "comprised of A," "having A" and "including A" in connection with a constituent element or the like in the following embodiment do not exclude other elements except the case where it is mentioned clearly that limitation is made to only the element referred to. Likewise, it is to be understood that when reference is made to the shapes and a positional relation of constituent elements in the following embodiment, those substantially closely similar to or resembling such shapes, etc. are also included unless otherwise specified and except the case where a negative answer is evident basically. This is also true of the foregoing numerical value and range.

An embodiment of the present invention will be described below in detail with reference to the accompanying drawings. In all the drawings for illustrating the embodiment, members having the same functions are identified by like reference numerals, and repeated explanations thereof will be omitted.

Embodiment

Figure 2:
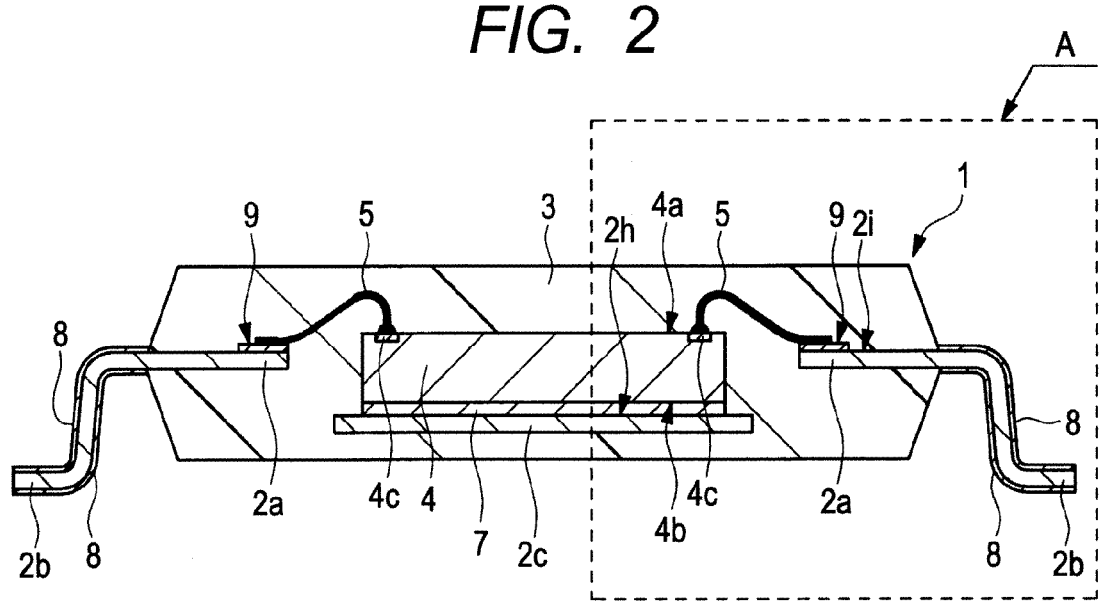
FIG. 2 is a sectional view showing a structure cut along line A-A in FIG. 1.
Figure 3:
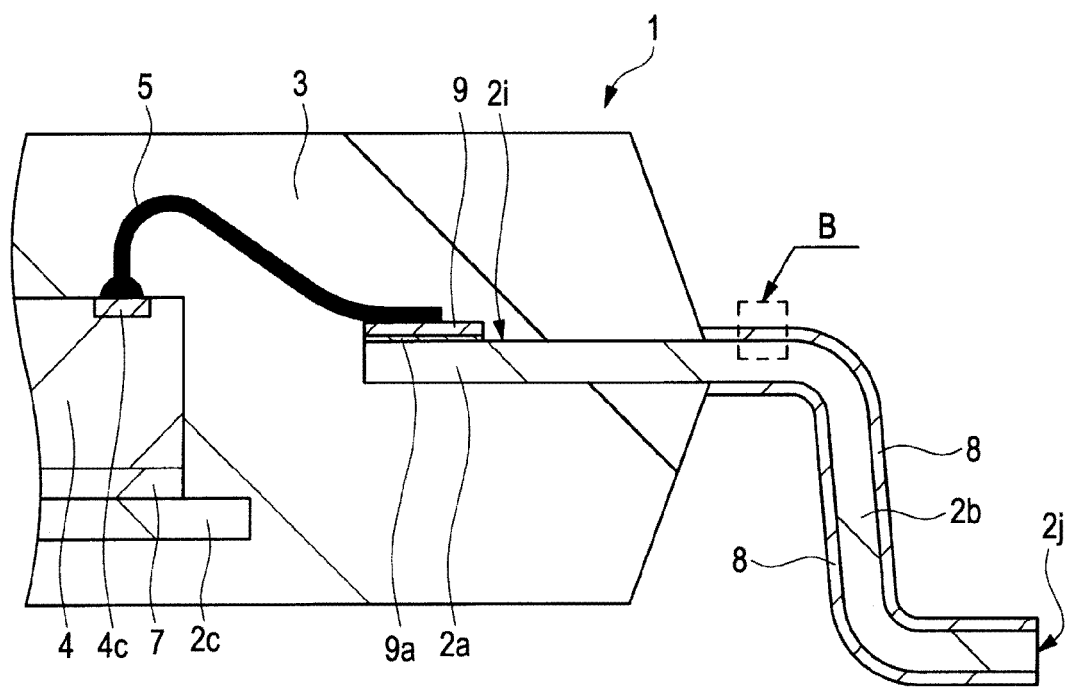
FIG. 3 is a sectional view showing an example of a plating structure in portion A of FIG. 2.

FIG. 1 is a plan view showing a structural example of a semiconductor device assembled by a method for manufacturing a semiconductor device according to an embodiment of the present invention, FIG. 2 is a sectional view showing a structure cut along line A-A in FIG. 1, and FIG. 3 is a partial sectional view showing an example of a plating structure in portion A shown in FIG. 2.

The semiconductor device of this embodiment is a resin-sealed type semiconductor package which is assembled using a lead frame. In this embodiment, such a multi-pin QFP (Quad Flat Package) 1 as shown in FIG. 1 will be referred to as an example of the semiconductor device of this embodiment.

A description will be given about the configuration of the QFP1 shown in FIGS. 1 and 2. The QFP 1 includes a semiconductor chip 4 formed with a semiconductor integrated circuit, plural inner leads 2a arranged radially around the semiconductor chip 4, plural outer leads 2b formed integrally with the inner leads 2a, and plural wires 5, e.g., gold wires, for coupling electrode pads 4c as surface electrodes formed on a main surface 4a of the semiconductor chip 4 and corresponding inner leads 2a with each other electrically.

The QFP1 further includes a tab (die pad) 2c as a chip mounting portion to which the semiconductor chip 4 is fixed through a die bonding material 7, e.g., silver paste, and a sealing body 3 formed of sealing resin or the like by resin molding to seal all of the semiconductor chip 4, tab 2c, wires 5 and inner leads 2a. Since the semiconductor device of this embodiment is QFP1, the outer leads 2b formed integrally with the inner leads 2a respectively project outwards from four sides of the sealing body 3 and are bent in a gull wing shape.

The electrode pads 4c, which are formed on the main surface 4a of the semiconductor chip 4 mounted on the QFP1, are arranged at a narrow pad pitch of 50 µm or less. Consequently, as the wires 5 there can be adopted, for example, gold wires having a diameter of 20 µm or less and it is possible to implement a multi-pin structure.

The inner leads 2a, outer leads 2b and tab 2c are each formed by a sheet member of iron-nickel alloy or copper alloy and the sealing body 3 is formed by resin molding with use of, for example, a thermosetting epoxy resin.

The semiconductor chip 4 is formed of silicon for example and a semiconductor integrated circuit is formed on the chip main surface 4a. Further, the semiconductor chip 4 is fixed onto a main surface 2h of the tab 2c through a die bonding material 7. That is, a back surface 4b of the semiconductor chip 4 and the main surface 2h of the tab 2c are bonded together through the die bonding material 7.

As shown in FIG. 3, a silver plating film 9 is formed on a wire bonding portion 2i near an end of each inner lead 2a to enhance the reliability of coupling with the associated wire 5, e.g., gold wire. The silver plating film 9 is formed on a copper undercoat 9a formed on a surface of the inner lead 2a.

In the QFP1 of this first embodiment, an exterior plating film 8, which is a lead-free plating film, is formed on a surface of each outer lead 2b projecting from the sealing body 3, as shown in FIG. 2.

However, as shown in FIG. 3, a cut face 2j at an outer end of each outer lead 2b is a face formed by cutting off the lead after forming the exterior plating film and therefore the exterior plating film 8 is not formed on the cut face 2j.

The exterior plating film 8 may be any of the following various lead-free plating films: tin (SN)-copper (Cu), tin (Sn)-silver (Ag), tin (Sn)-bismuth (Bi), and pure tin (Sn), plating films.

Next, a method for manufacturing the semiconductor device (QFP1) according to this embodiment will be described with reference to a manufacturing flow chart of FIG. 4.

Figure 4:
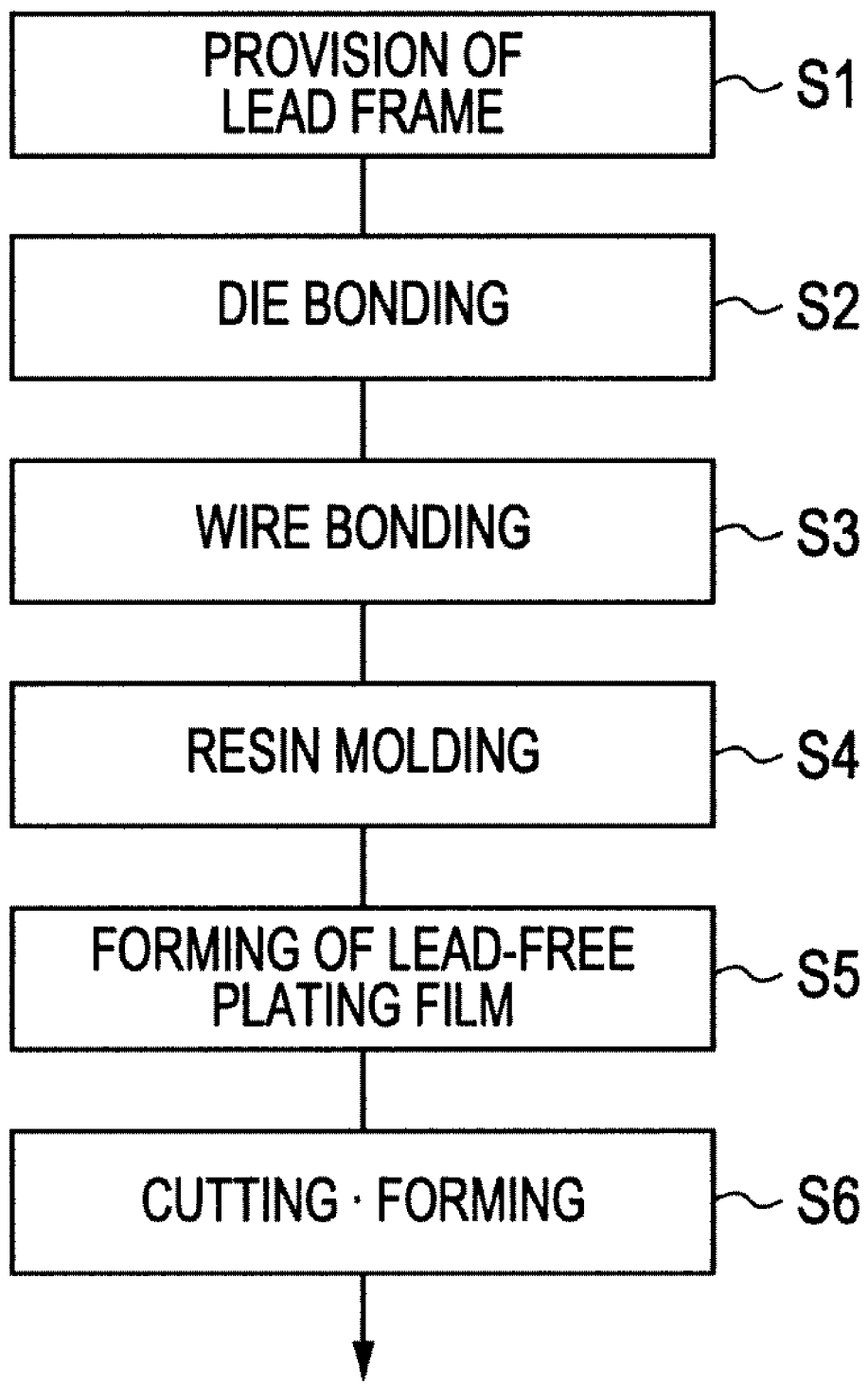
FIG. 4 is a manufacturing flow chart showing a procedural example for assembling the semiconductor device of FIG. 1.
Figure 5:
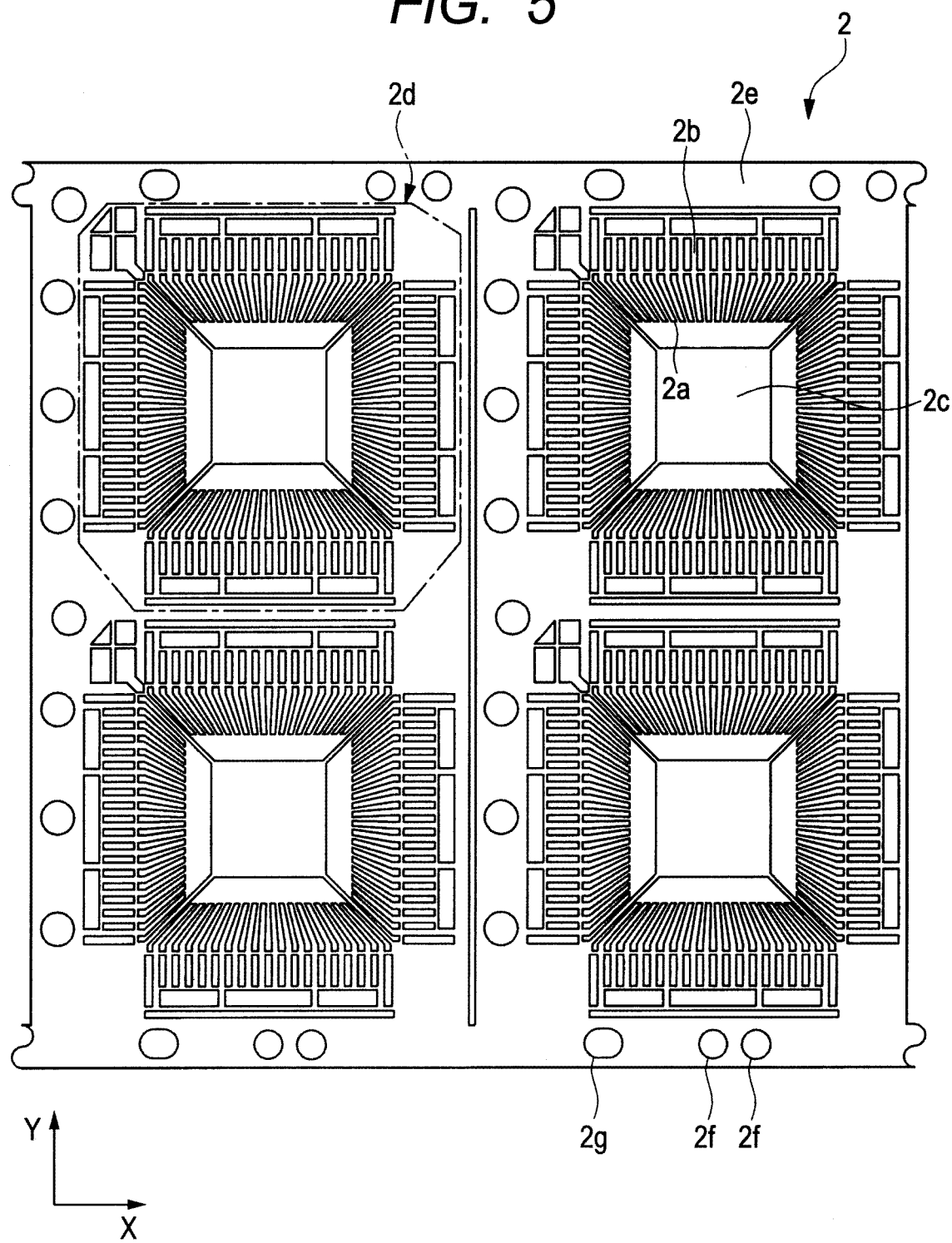
FIG. 5 is an enlarged partial plan view showing a structural example of a lead frame used in assembling the semiconductor device of FIG. 1.
Figure 6:
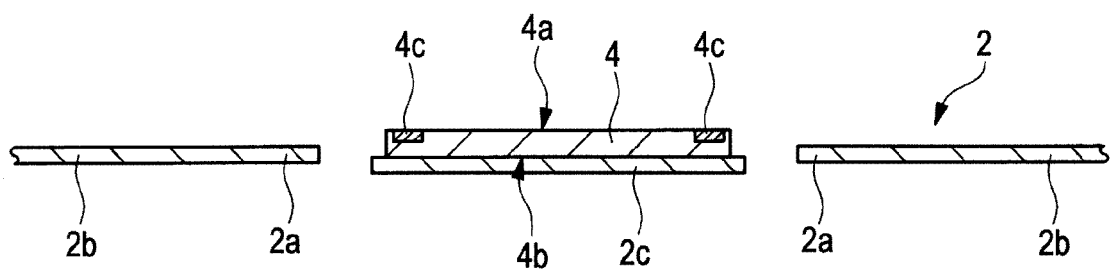
FIG. 6 is a partial sectional view showing a structural example after die bonding in assembling the semiconductor device of FIG. 1.
Figure 7:
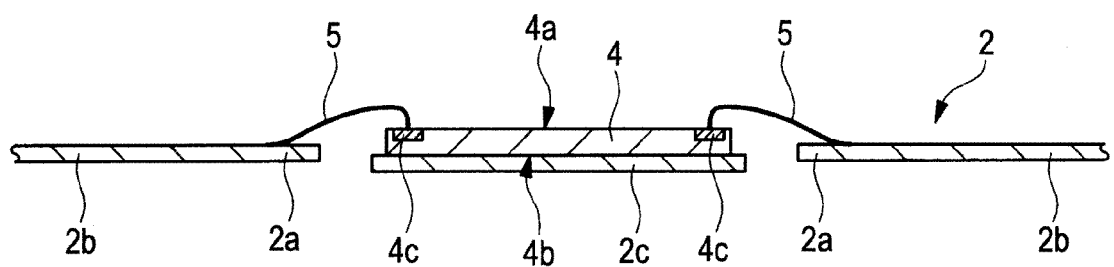
FIG. 7 is a partial sectional view showing a structural example after wire bonding in assembling the semiconductor device of FIG. 1.
Figure 8:
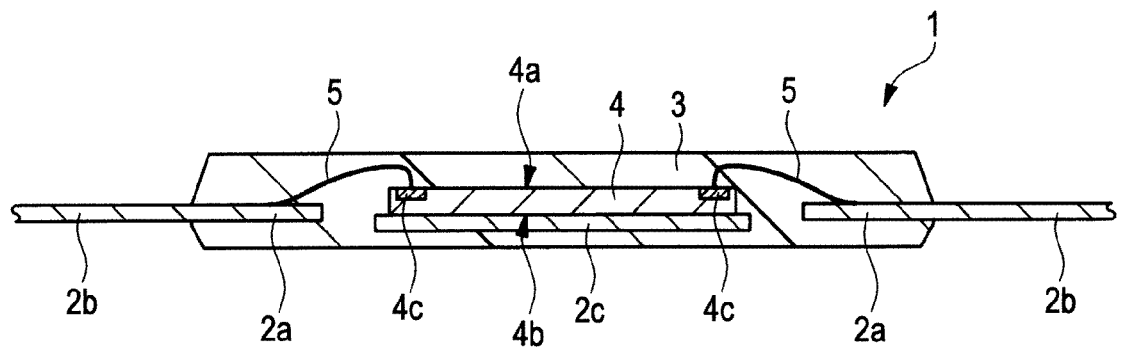
FIG. 8 is a partial sectional view showing a structural example after resin molding in assembling the semiconductor device of FIG. 1.
Figure 9:
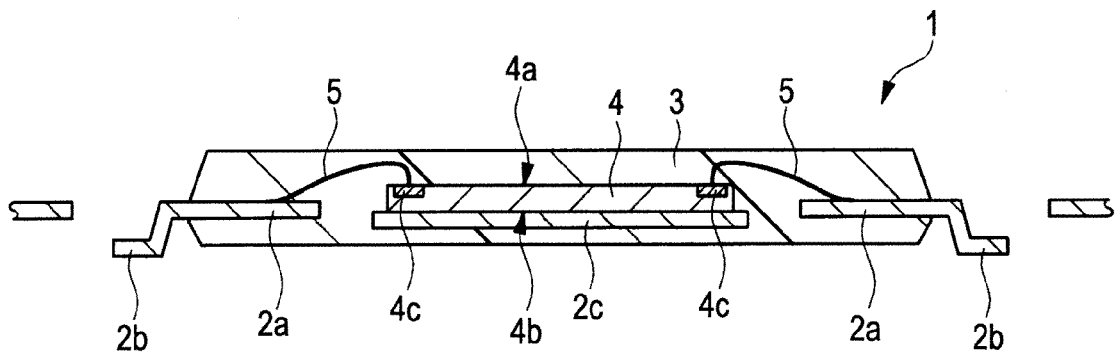
FIG. 9 is a partial sectional view showing a structural example after cutting and forming in assembling the semiconductor device of FIG. 1.

FIG. 4 is a manufacturing flow chart showing a procedural example for assembling the semiconductor device of FIG. 1, FIG. 5 is a partially enlarged plan view showing a structural example of a lead frame used in assembling the semiconductor device of FIG. 1, and FIG. 6 is a partial sectional view showing a structural example after die bonding in assembling the semiconductor device of FIG. 1. Further, FIG. 7 is a partial sectional view showing a structural example after wire bonding in assembling the semiconductor device of FIG. 1, FIG. 8 is a partial sectional view showing a structural example after resin molding in assembling the semiconductor device of FIG. 1, and FIG. 9 is a partial sectional view showing a structural example after cutting and forming in assembling the semiconductor device of FIG. 1.

First, Provision of Lead Frame of step S1 in FIG. 4 is performed. In this step, a matrix frame 2 as an example of the lead frame shown in FIG. 5 is provided. Plural device areas 2d each for mounting the semiconductor chip 4 thereon are formed side by side in the matrix frame 2, with plural inner leads 2a and outer leads 2b being formed in each device area 2d.

In the matrix frame 2 of FIG. 5 used in this embodiment, device areas 2d each for forming one QFP1 are formed in a matrix layout in plural rows by plural columns (for example, 2 rows by 2 columns in FIG. 5), and in each device area 2d are formed one tab (die pad) 2c and plural inner leads 2a and plural outer leads 2b both arranged around the tab 2c.

For example, the matrix frame 2 is a rectangular sheet member formed using iron-nickel alloy or copper alloy. In the matrix frame 2, tabs 2c and inner and outer leads 2a, 2b are formed in an integrally coupled state of each tab 2c and plural inner and outer leads 2a, 2b. In the matrix frame 2 shown in FIG. 5, X direction is a longitudinal direction of the rectangle and Y direction is a width direction of the rectangle.

Plural elongated positioning holes 2g and guiding sprocket holes 2f, which are to be used in the manufacturing process, are formed in frame portions 2e at both ends in the width direction of the matrix frame 2.

In the matrix frame 2 shown in FIG. 5, the number of inner leads 2a in each device area 2d is different from that of outer leads 2b in the QFP1 of FIG. 1, but this is for showing the shape of the lead portion in the matrix frame 2 in an easily understandable manner. It goes without saying that the number of inner leads 2a in each device area 2d of the matrix frame 2 used for assembling the QFP1 is the same as the number of outer leads 2b in the QFP1.

Thereafter, Die Bonding of step S2 in FIG. 4 is performed. In this step, as shown in FIG. 6, a semiconductor chip 4 is mounted through a die bonding material 7 onto the tab 2c in each of the device areas 2d of the matrix frame 2. That is, as shown in FIG. 2, the back surface 4b of the semiconductor chip 4 and the main surface 2h of the tab 2c are bonded together through the die bonding material 7.

Thereafter, Wire Bonding of step S3 in FIG. 4 is performed. More specifically, as shown in FIG. 7, the electrode pads 4c on the main surface 4a of the semiconductor chip 4 and corresponding inner leads 2a are coupled together electrically through wires 5. The wires 5 are, for example, gold wires.

After the wire bonding, Resin Molding of step S4 in FIG. 4 is performed. In this step, in each device area 2d of the matrix frame 2, the tab 2c, semiconductor chip 4, inner leads 2a and wires 5, which are shown in FIG. 8, are sealed with sealing resin with use of a resin molding die (not shown), to form a sealing body 3. The sealing resin is, for example, a thermosetting epoxy resin.

Thereafter, Forming of Lead-free Plating Film of step S5 in FIG. 4 is performed. This lead-free plating film corresponds to the exterior plating film 8 shown in FIG. 2.

Thereafter, Cutting and Forming of step S6 in FIG. 4 is performed. As shown in FIG. 9, outer leads 2b are cut off from the frame portions 2e of the matrix frame shown in FIG. 5 and are then bent in a gull wing shape to complete the assembling of QFP1.

The following description is now provided about the exterior plating film 8 which is a lead-free plating film formed on the surface of each outer lead 2b in the QFP1 of this embodiment.

Figure 10:
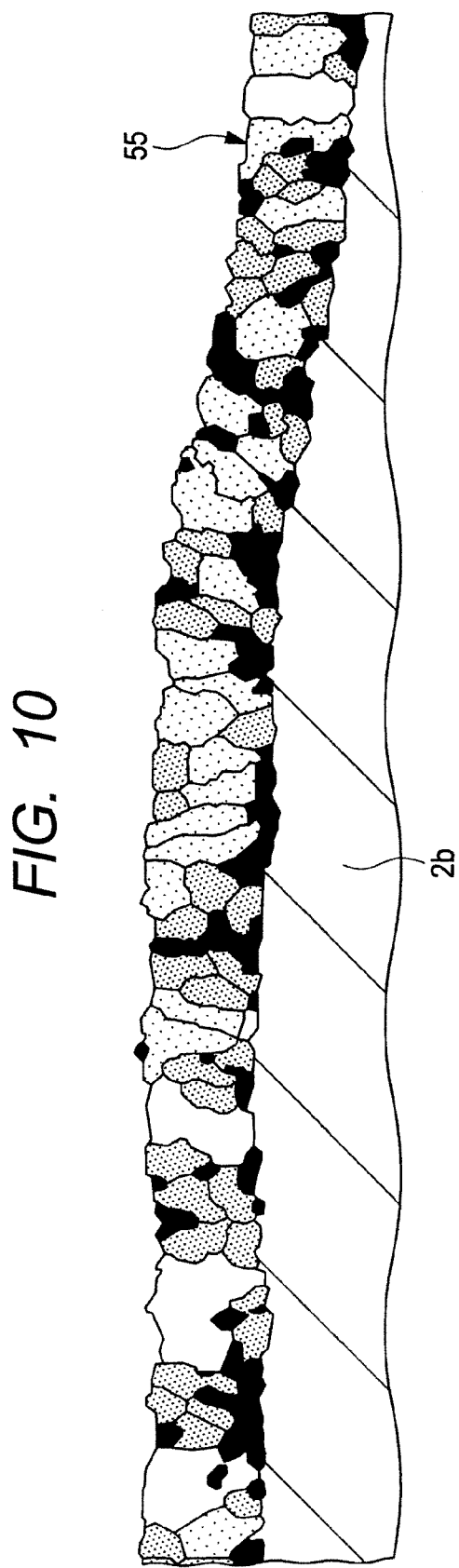
FIG. 10 is a partial sectional view showing a structure before improvement of an exterior plating film shown in portion B of FIG. 3.
Figure 11:
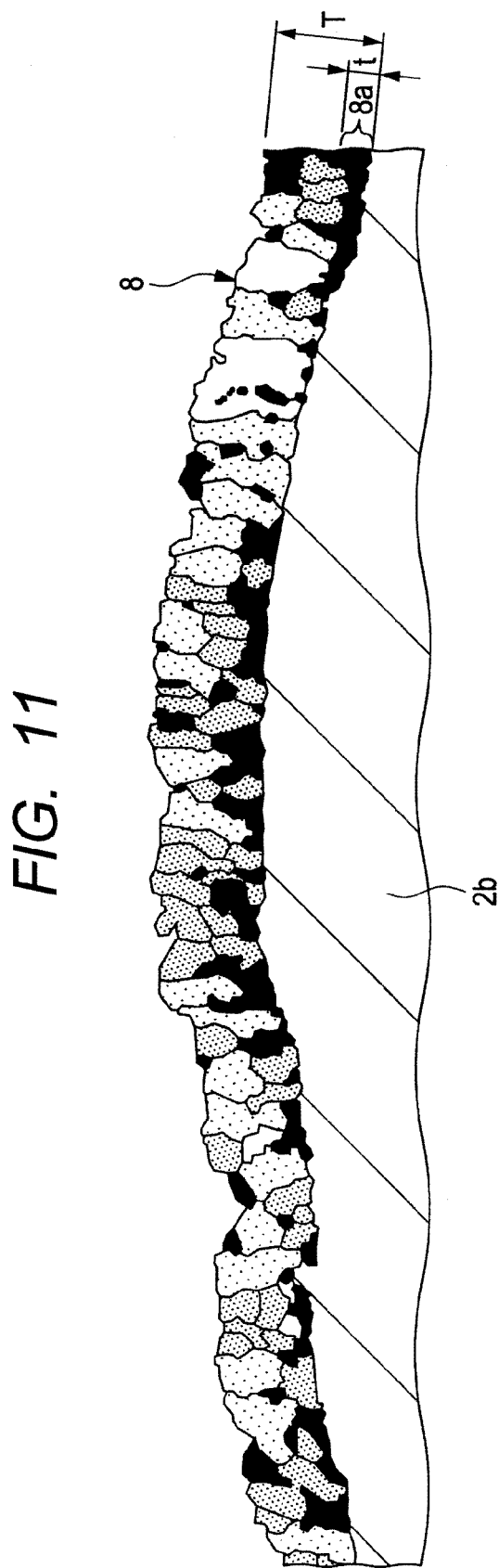
FIG. 11 is a partial sectional view showing a structure after improvement of the exterior plating film (the embodiment) shown in portion B of FIG. 3.
Figure 12:
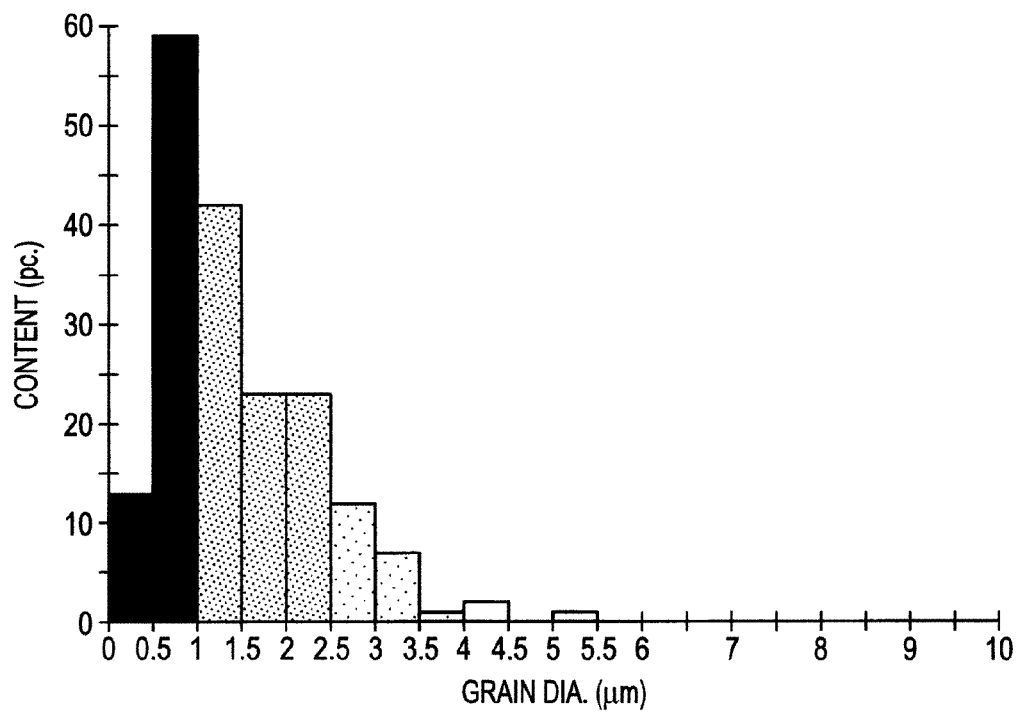
FIG. 12 is a diagram showing grain contents diameter by diameter in the exterior plating film of FIG. 10.
Figure 13:
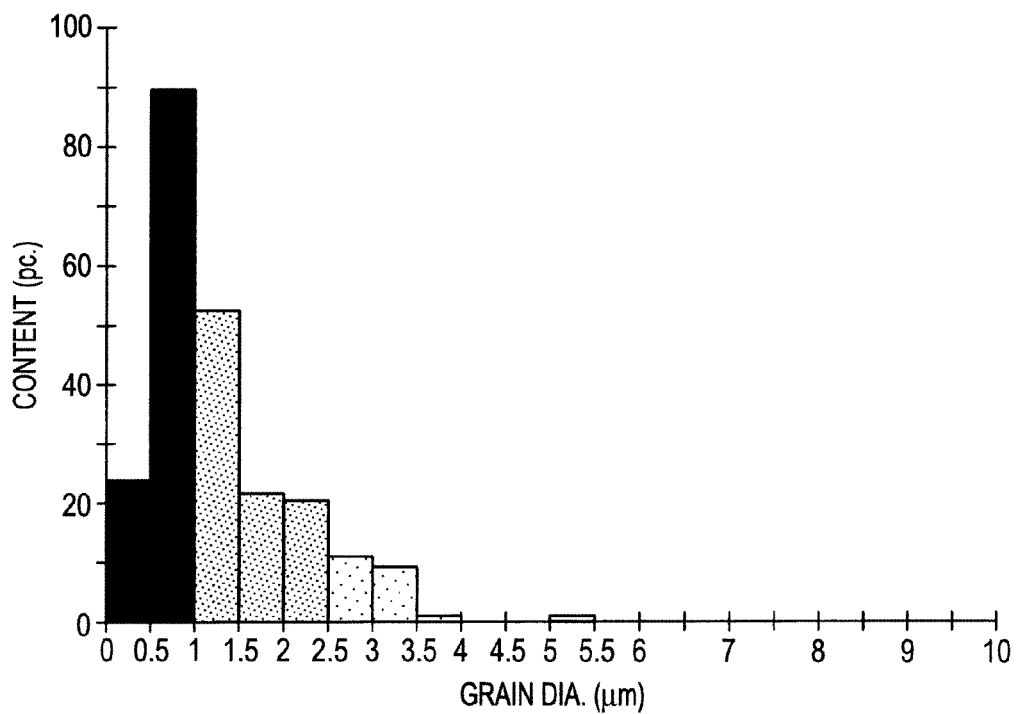
FIG. 13 is a diagram showing an example of grain contents diameter by diameter in the exterior plating film of FIG. 11.
Figure 14:
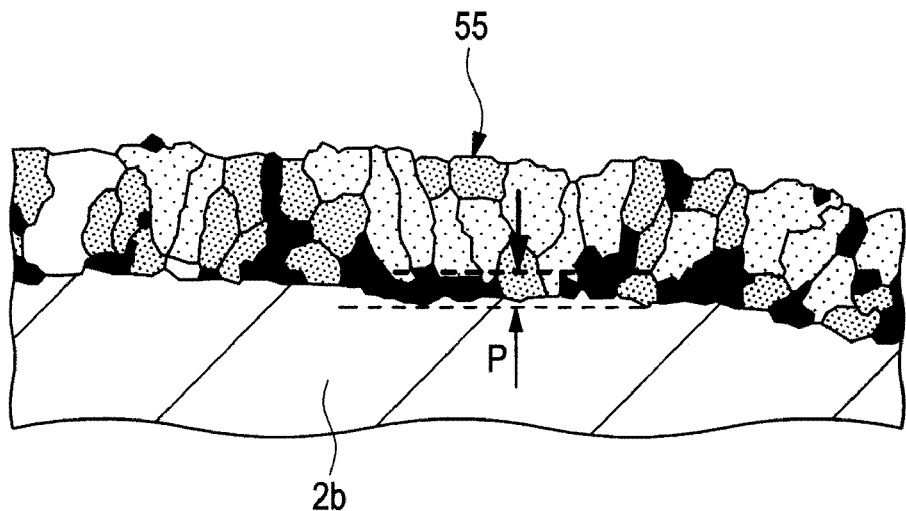
FIG. 14 is a partially enlarged sectional view showing a part of the structure of FIG. 10 on a larger scale.
Figure 15:
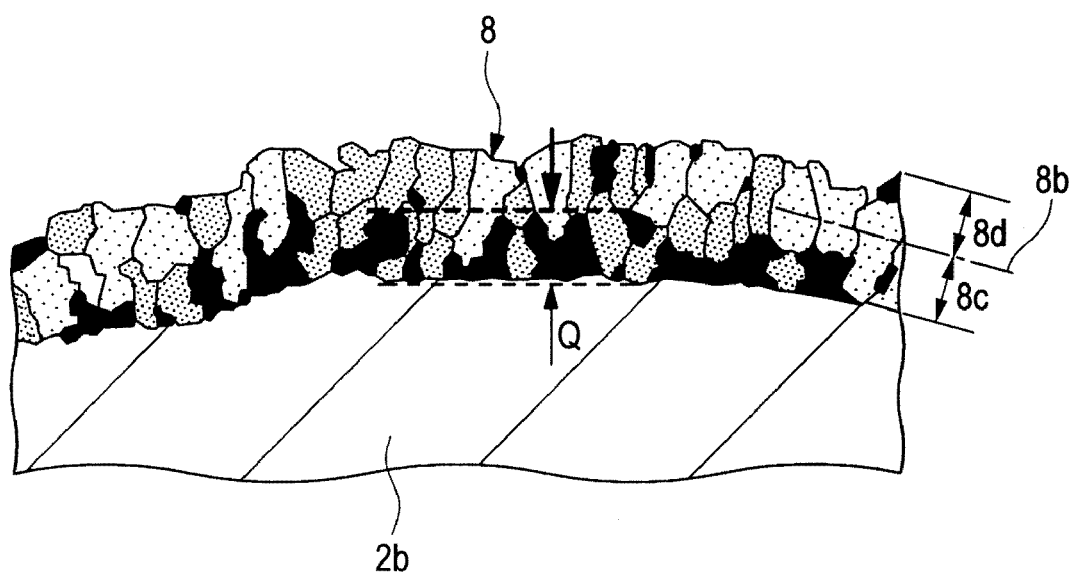
FIG. 15 is a partially enlarged sectional view showing a part of the structure of FIG. 11 on a larger scale.

FIG. 10 is a partial sectional view showing a structure before improvement of the exterior plating film indicated at portion B in FIG. 3, FIG. 11 is a partial sectional view showing a structural example after improvement (this embodiment) of the exterior plating film indicated at portion B in FIG. 3, FIG. 12 is a diagram showing grain contents diameter by diameter in the exterior plating film of FIG. 10, FIG. 13 is a diagram showing an example of grain contents diameter by diameter in the exterior plating film of FIG. 11, FIG. 14 is a partially enlarged sectional view showing a part of the structure of FIG. 10 on a larger scale, and FIG. 15 is a partially enlarged sectional view showing apart of the structure of FIG. 11 on a larger scale. Further, FIG. 16 is a data diagram showing grain diameter distributions of the exterior plating film before and after improvement shown in FIGS. 12 and 13, FIG. 17 is a data diagram showing average sectional areas of all grains in the exterior plating film before and after improvement shown in FIGS. 14 and 15, FIG. 18 is a data diagram showing an example of linear expansion coefficients crystal orientation by crystal orientation in the exterior plating film, and FIG. 19 is a data diagram showing mean values with respect to the difference in linear expansion coefficient between the exterior plating film and the lead before and after improvement.

Characteristics of the exterior plating film 8 in this embodiment will be described below while making comparison between the conventional exterior plating film 55 before improvement shown in FIG. 10 with no improvement made against the growth of whisker and the exterior plating film 8 after improvement shown in FIG. 11 (this embodiment) with improvement made against the growth of whisker. In the following description reference will be made to an example in which the exterior plating films 8 and 55 are lead-free tin-copper plating films. Further, the following description of characteristics of the exterior plating film 8 will be made under a comparison between before improvement (exterior plating film 55) and after improvement (exterior plating film 8) with respect to grain diameter, linear expansion coefficient and orientability in the plating films.

First, FIGS. 10 and 11 illustrate data on grain distributions diameter by diameter in the plating thickness direction before (FIG. 10) and after (FIG. 11) improvement. In each figure, the deeper the area color, the larger the number of small-diameter grains present in the area concerned.

It is seen that plural plating grains of different diameters are contained in the exterior plating film 55 before improvement shown in FIG. 10 and like grains are contained in the exterior plating film 8 after improvement shown in FIG. 11. However, it is seen that the grains after improvement are smaller in diameter than those before improvement. In each figure, the area of the deepest color (black color) is an area where plating grains not larger than 1 μm in diameter are present.

Further, after improvement shown in FIG. 11, the thickness t of a grain layer (fine grain layer) 8a having grains not larger than 1 μm in diameter is one-tenth of the thickness T of the exterior plating film 8.

FIGS. 12 and 13 illustrate relations between plating grain diameter and grain content in the exterior plating films 8 and 55 before (FIG. 12) and after (FIG. 13) improvement. It is seen that grains not larger than 1 μm in diameter are contained many in the exterior plating films 8 and 55.

FIG. 14 is an extracted and enlarged diagram of a part of the structure before improvement (FIG. 10), showing the result of having searched for an area where grains not larger than 1 μm are present. In this case, the area where grains not larger than 1 μm in diameter are present is an area corresponding to the thickness P from an interface with an outer lead 2b. The value of P is about 1.5 μm.

On the other hand, FIG. 16 is an extracted and enlarged diagram of a part of the structure after improvement (FIG. 11), showing the result of having searched for an area where grains not larger than 1 μm are present. In this case, the area where grains not larger than 1 μm are present is an area corresponding to the thickness Q from the interface with the outer lead 2b. The value of Q is about 3.0 μm. Thus it is seen that the number of grains not larger than 1 μm has increased to about twice that before improvement (FIG. 14).

That is, if the grain layer 8a shown in FIG. 11, which is not larger than 1 μm in grain diameter, is present 1.5 μm or more, it is possible to obtain a tin whisker suppression improving effect. The grain layer 8a may be present at any position within the plating film insofar as the grain layer 8*a* shown in FIG. 11, which is not larger than 1 μm in diameter, is present 1.5 μm or more.

In the exterior plating film 8 after improvement, as shown in FIG. 15, grains not larger than 1 μm in diameter are present in a larger number on an interface side 8*c* of the exterior plating film closer to the outer lead 2*b* with respect to a center 8*b* in the plating thickness direction than on a surface side 8*d* closer to the surface of the exterior plating film 8.

This is for the following reason. If the difference in linear expansion coefficient between the lead and the exterior plating film 8 is large, whisker is apt to be formed as noted previously. Therefore, a larger number of grains small in diameter are made present on the interface side 8*c* of the exterior plating film 8 closer to the lead, thereby diminishing the difference in linear expansion coefficient between the plating film and the lead to suppress the formation of whisker.

Next, FIG. 16 shows the results of having checked grain diameters in the exterior plating structures shown in FIGS. 10 and 11. It is seen that after improvement (FIG. 11), in comparison with before improvement (FIG. 10), the proportion of 1 μm or smaller diameter grains present in the state after plating is high. It is characteristic that the said proportion is not lower than 45% in the entire exterior plating film, not lower than 50% near the interface between the lead (frame member) and the exterior plating film 8, and not lower than 35% near the surface of the exterior plating film 8.

Further, it is characteristic that even in the state after a temperature cycle environmental test there remain 45% or more grains not larger than 1 μm in diameter.

Figure 30:
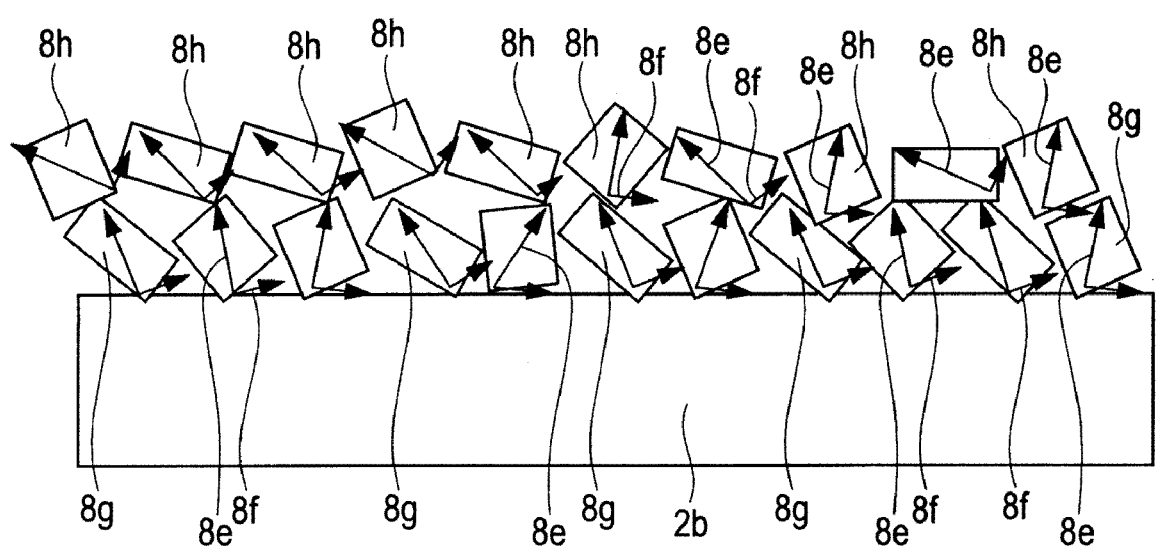
FIG. 30 is a schematic diagram showing a second step of the estimated precipitation principles in the exterior plating film after improvement.
Figure 31:
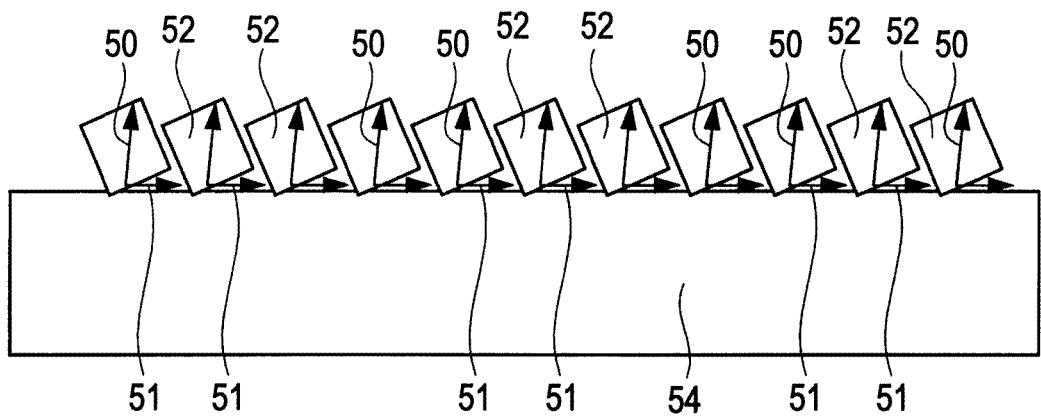
FIG. 31 is a schematic diagram showing a first step of estimated precipitation principles in dull plating (exterior plating film) according to a comparative example.
Figure 32:
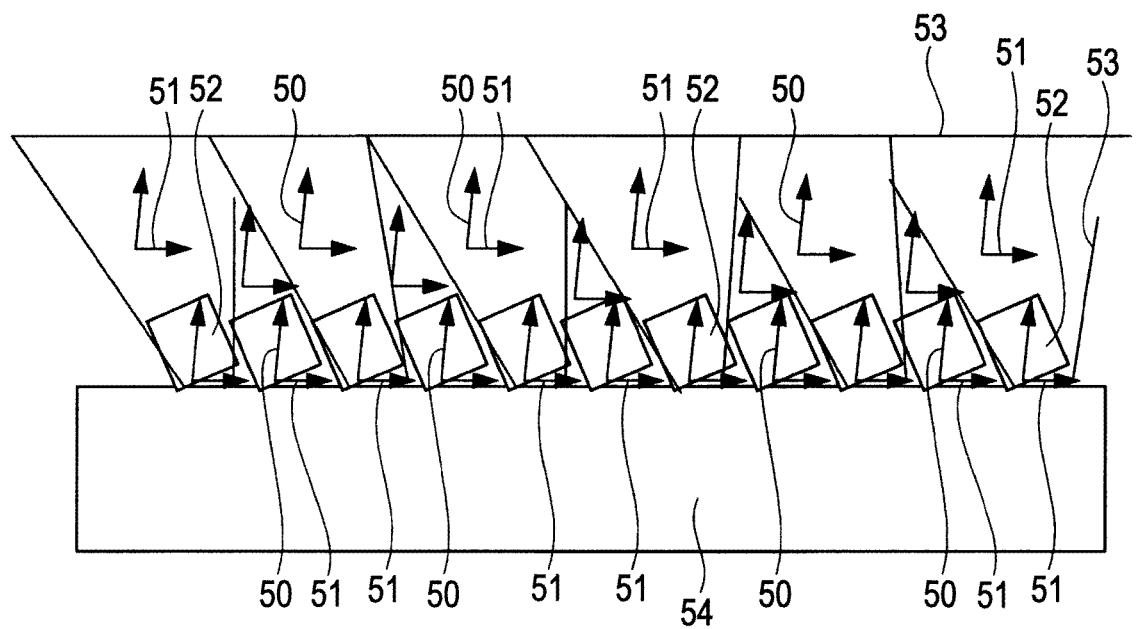
FIG. 32 is a schematic diagram showing a second step of the estimated precipitation principles in dull plating (exterior plating film) according to the comparative example.

Thus, from FIG. 16 it is considered preferable that 45% or more grains not larger than 1 μm in diameter be present when looking at the entire plating film and that 50% or more such grains be present near the interface between a lead of, for example, iron-nickel alloy or copper alloy and the plating film, namely, at the position of the interface side 8*c* closer to the outer lead 2*b* with respect to the center 8*b* in the thickness direction of the exterior plating film 8 shown in FIG. 15, and 30% or more at the position of the surface side 8*d* closer to the surface of the exterior plating film 8 with respect to the plating thickness center 8*b*.

Further, it is preferable that after the temperature cycle environmental test in which the growth of tin whisker is marked there remain (exist) 45% or more grains not larger than 1 μm in diameter.

In the case of after improvement shown in FIG. 16 it is possible to suppress the formation of whisker at any of the positions referred to above.

FIG. 17 shows the results of having determined an average sectional area for each plating grain in the exterior plating structures shown in FIGS. 10 and 11. It is seen that after improvement (FIG. 11) the average sectional area is smaller as a whole than before improvement (FIG. 10). This is the same as the foregoing increase in the proportion of small-diameter grains.

As to an average sectional area of plural plating grains contained in the exterior plating film, it is characteristic that the average sectional area is 2.5 μm² or less in the entire exterior plating film, 1.6 μm² or less near the interface (interface side 8*c*) between the lead (frame member) and the exterior plating film 8, and 2.4 μm² or less near the surface (surface side 8*d*).

Thus, from the results of FIG. 17 it is preferable that an average sectional area of plating grains contained in the exterior plating film be 2.5 μm² or less in the entire exterior plating film, 2.4 μm² or less near the surface (the surface side 8*d* in FIG. 15), and 1.6 μm² or less near the interface (the interface side 8*c* in FIG. 15) between iron-nickel alloy or copper alloy and the exterior plating film 8.

In the case of after improvement shown in FIG. 17 it is possible to suppress the formation of whisker at any of the positions referred to above.

Next, with respect to orientability and linear expansion coefficient of the exterior plating film 8 in this embodiment, characteristics will be described below.

It is known that each grain in the exterior plating film 8 has orientability and that due to the said orientability there occurs a difference in linear expansion coefficient. FIG. 18 shows linear expansion coefficients for various orientations of tin. It is seen that linear expansion coefficients of grains differ depending on orientations and that linear expansion coefficients are distributed over the range of about 15 to 23 ppm. It is said that tin generally ranges in linear expansion coefficient from 16 to 22 ppm (23 ppm will also do), corresponding to a rather large distribution range of linear expansion coefficients for various orientations.

In the case where leads, including the outer leads 2*b*, are formed of iron-nickel alloy, a linear expansion coefficient thereof is about 5 ppm, and in case of the leads being formed of copper alloy, a linear expansion coefficient thereof is about 17 ppm.

For diminishing the formation of tin whisker it is necessary to diminish the difference in linear expansion coefficient between the exterior plating film 8 and the lead (frame member) and therefore it is preferable that the exterior plating film 8 be a gathering of grains small in linear expansion coefficient.

Consequently, it is preferable that the exterior plating film 8 be comprised of orientable grains not larger than 21 ppm in terms of linear expansion coefficient of tin, whereby it is possible to diminish the formation of tin whisker.

FIG. 19 shows the results of having determined average linear expansion coefficient differences from the structure of the exterior plating film 55 before improvement (FIG. 10) and that after improvement (FIG. 11). An average linear expansion coefficient after improvement (FIG. 11) is 15.9 ppm, proving that it is smaller than that before improvement (FIG. 10) which is 16.5 ppm.

Thus, it is preferable that an average linear expansion coefficient difference (a difference in linear expansion coefficient between lead and plating) determined by orientability resulting from plating film analyses before and after improvement of the exterior plating film 8 be 16.3 ppm or less.

Figure 20:
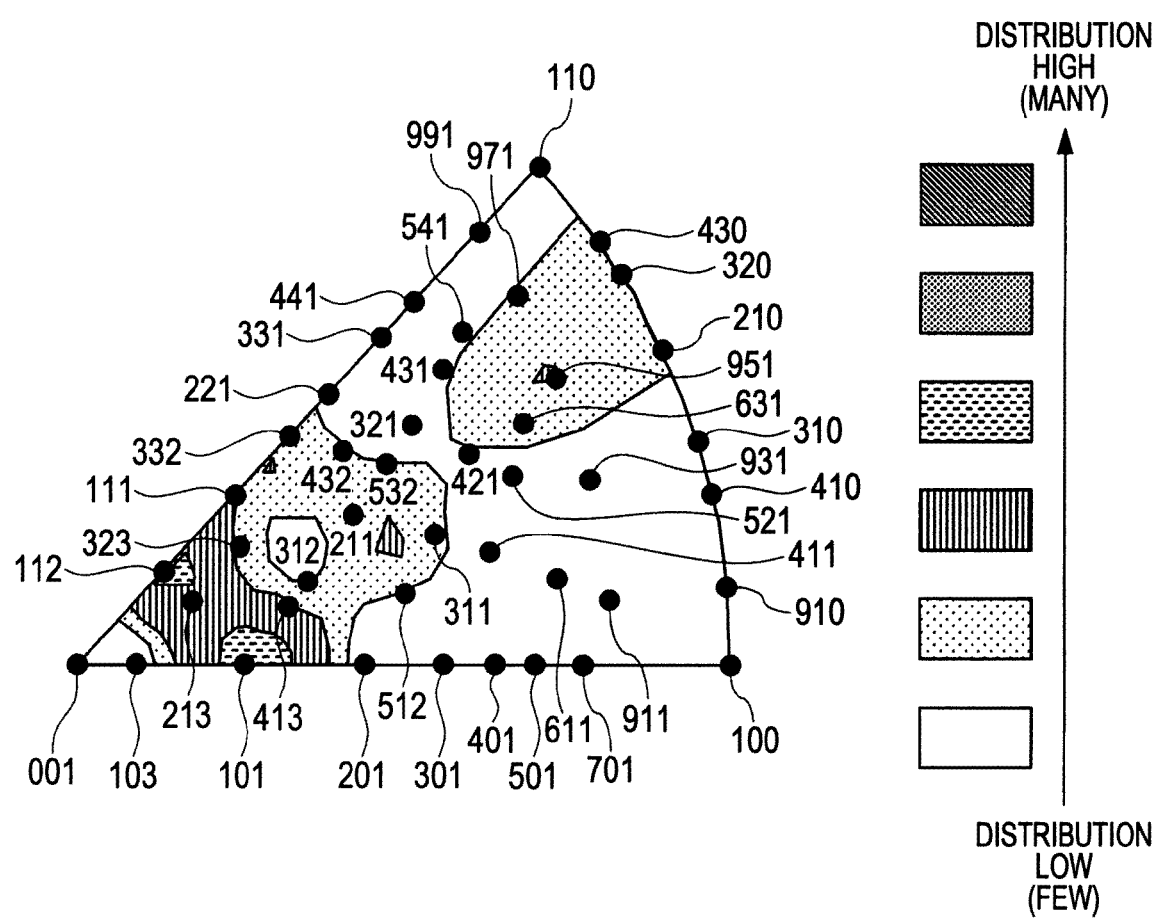
FIG. 20 is a data diagram showing crystal orientability of the exterior plating film before improvement shown in FIG. 10 when looking in a horizontal direction with respect to the lead.
Figure 21:
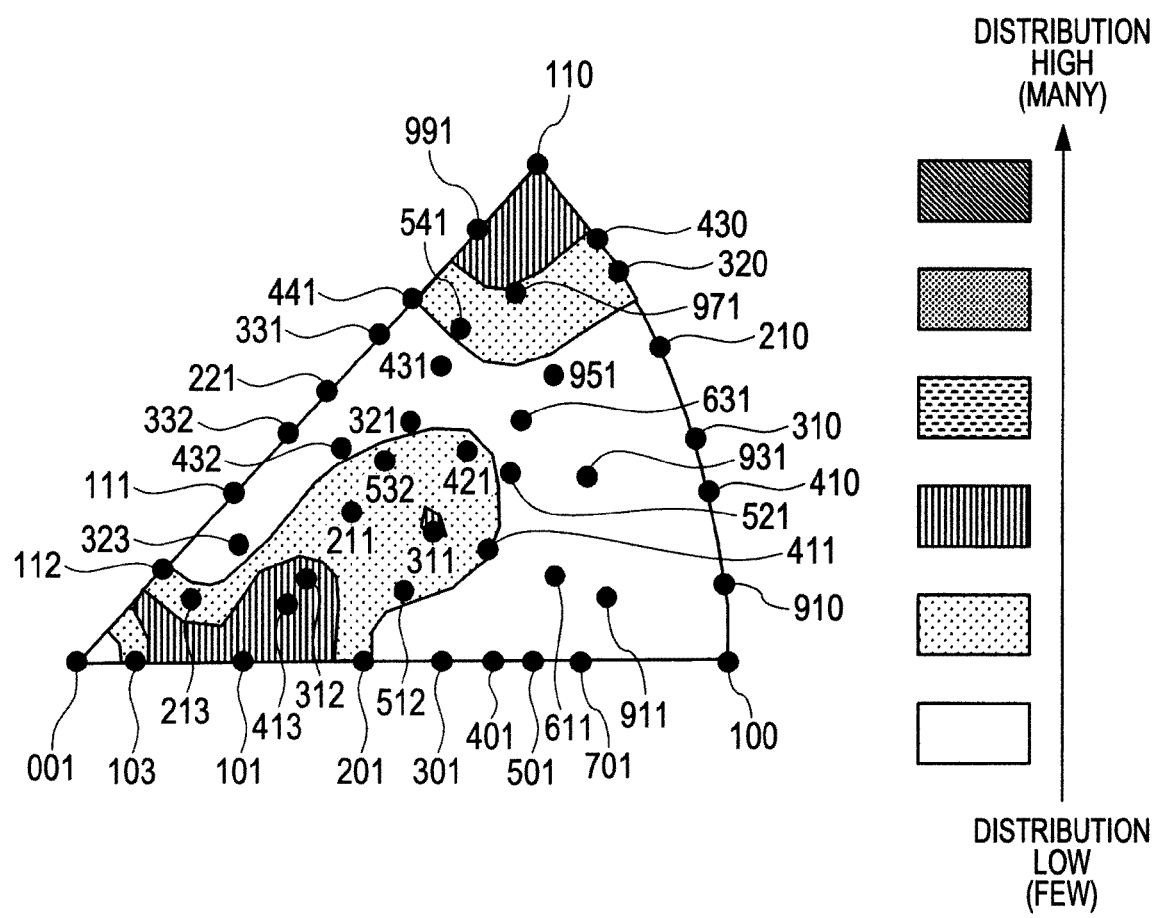
FIG. 21 is a data diagram showing crystal orientability of the exterior plating film after improvement (the embodiment) shown in FIG. 11 when looking in a horizontal direction with respect to the lead.
Figure 22:
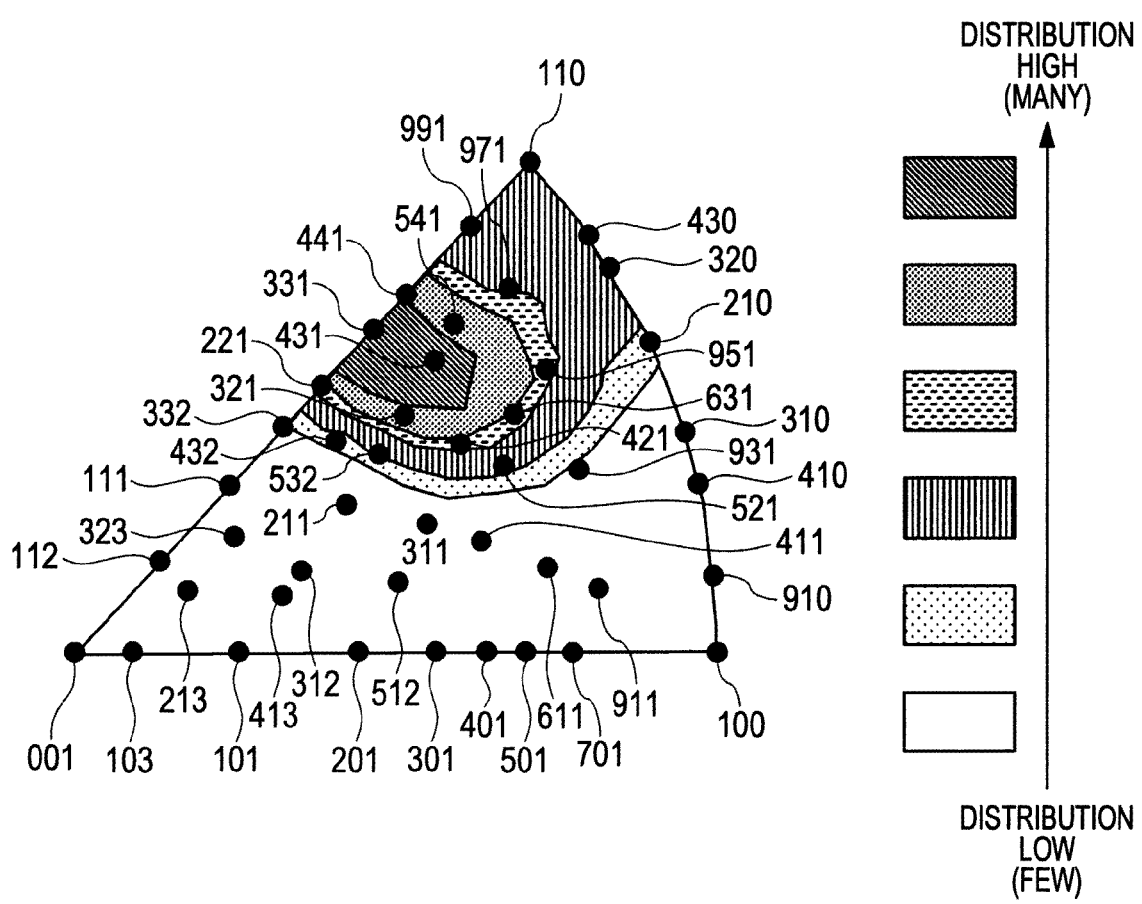
FIG. 22 is a data diagram showing crystal orientability of the exterior plating film before improvement shown in FIG. 10 when looking in a direction perpendicular to the lead.
Figure 23:
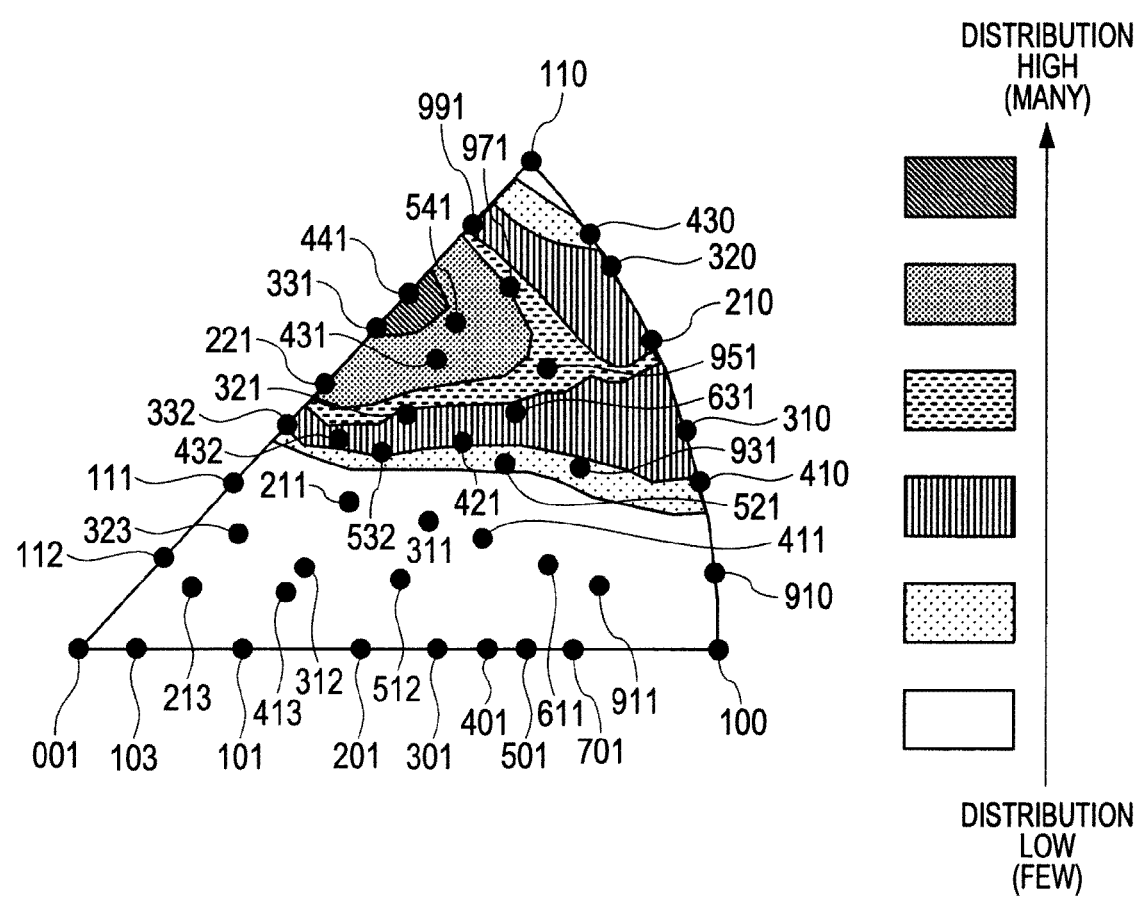
FIG. 23 is a data diagram showing crystal orientability of the exterior plating film after improvement (the embodiment) when looking in a direction perpendicular to the lead.
Figure 24:
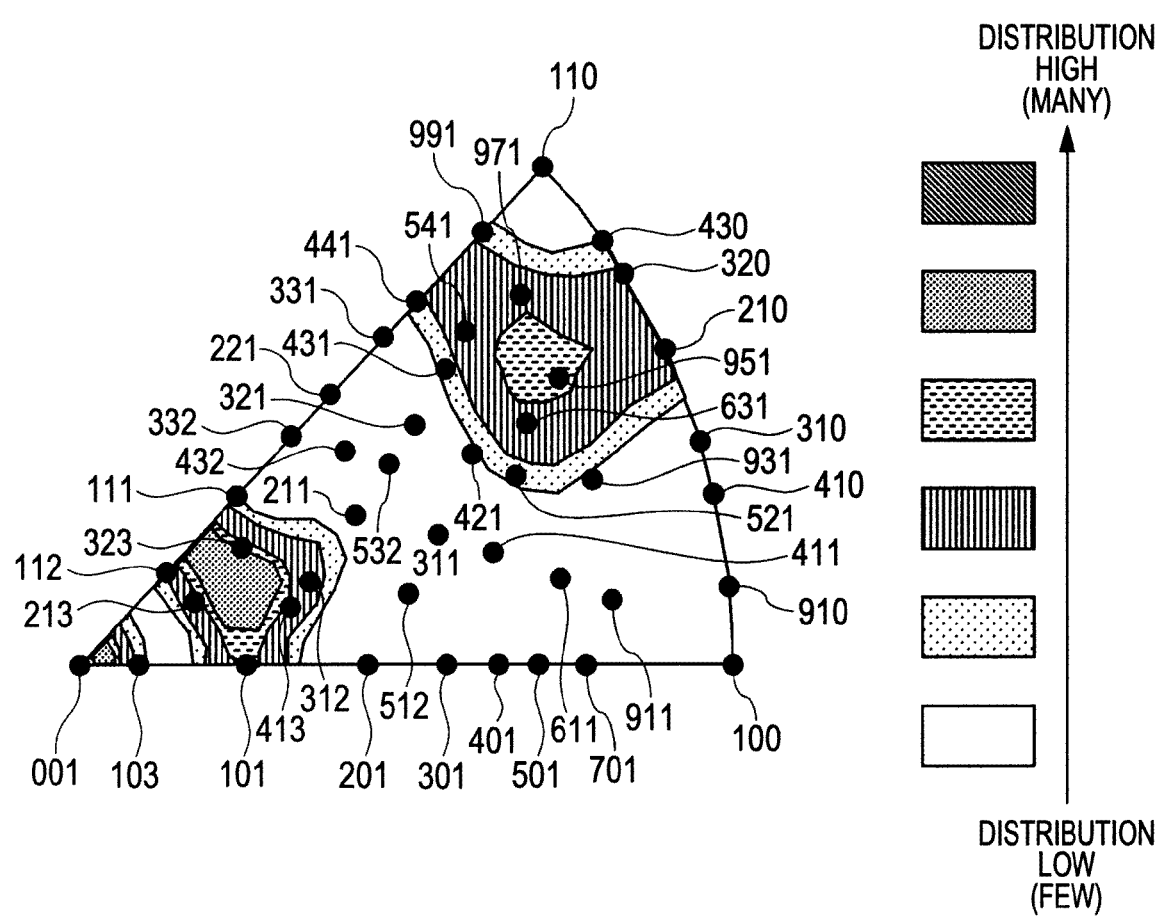
FIG. 24 is a data diagram showing crystal orientability of the exterior plating film (after temperature cycle) before improvement shown in FIG. 10 when looking in a horizontal direction with respect to the lead.
Figure 25:
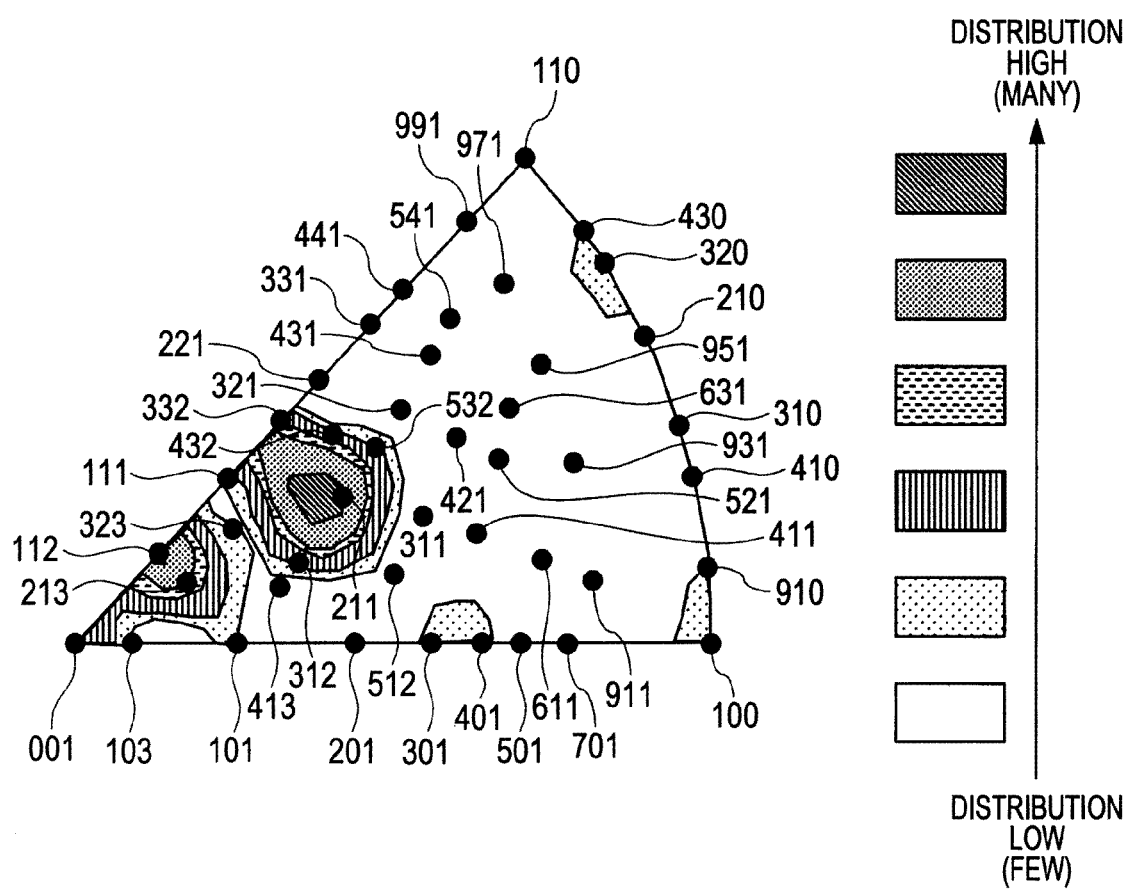
FIG. 25 is a data diagram showing crystal orientability of the exterior plating film (after temperature cycle) after improvement (the embodiment) shown in FIG. 11 when looking in a horizontal direction with respect to the lead.
Figure 26:
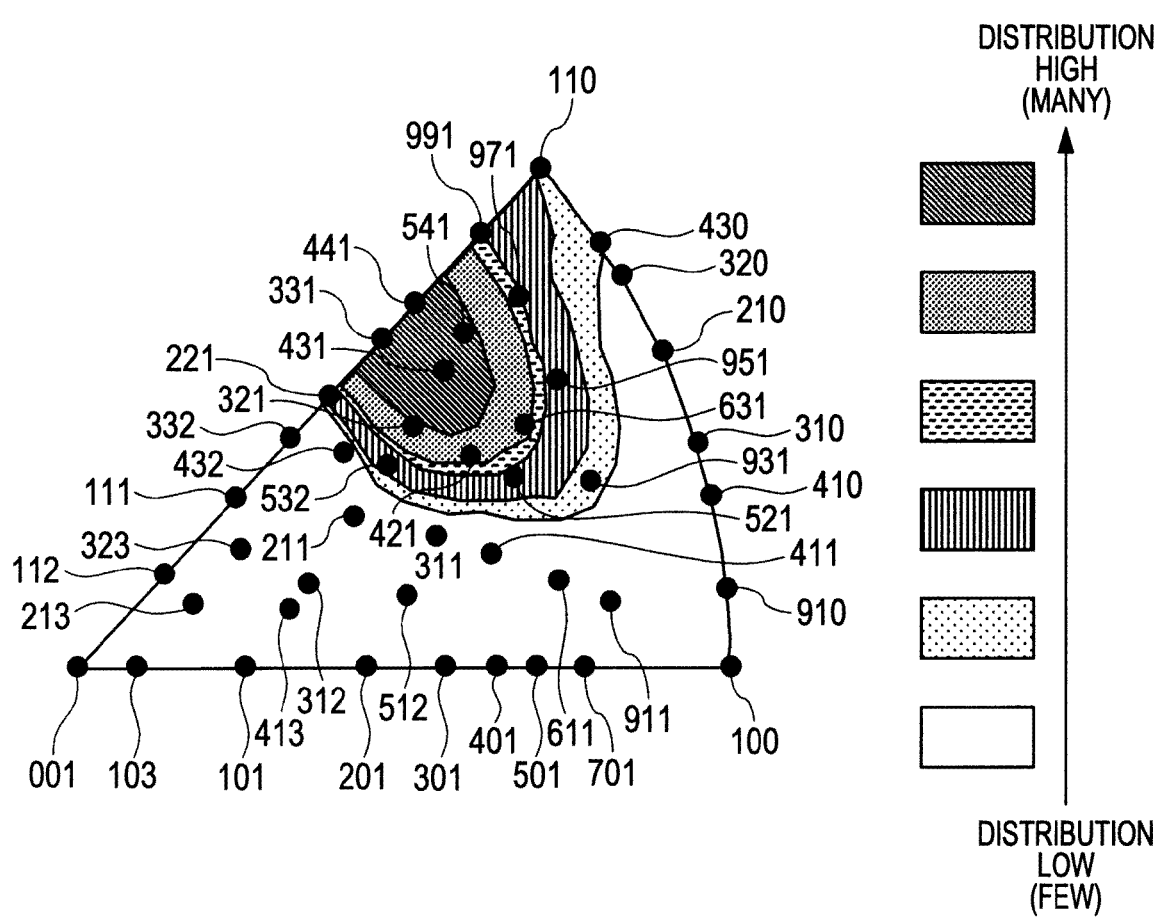
FIG. 26 is a data diagram showing crystal orientability of the exterior plating film (after temperature cycle) before improvement shown in FIG. 10 when looking in a direction perpendicular to the lead.
Figure 27:
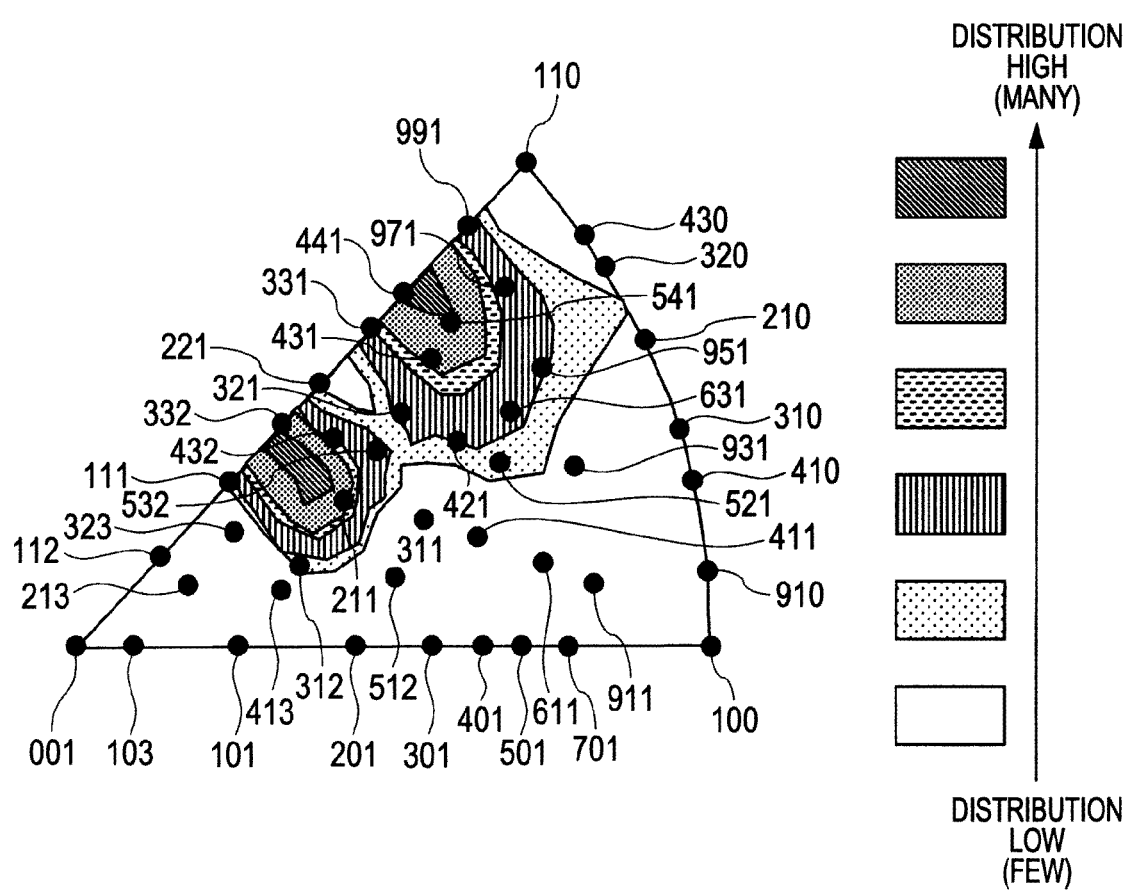
FIG. 27 is a data diagram showing crystal orientability of the exterior plating film (after temperature cycle) after improvement (the embodiment) shown in FIG. 11 when looking in a direction perpendicular to the lead.

FIG. 20 is a data diagram showing crystal orientability of the exterior plating film before improvement shown in FIG. 10 when looking in a horizontal direction with respect to the lead, FIG. 21 is a data diagram showing crystal orientability of the exterior plating film after improvement (this embodiment) shown in FIG. 11 when looking in a horizontal direction with respect to the lead, FIG. 22 is a data diagram showing crystal orientability of the exterior plating film before improvement shown in FIG. 10 when looking in a direction perpendicular to the lead, and FIG. 23 is a data diagram showing crystal orientability of the exterior plating film after improvement (this embodiment) when looking in a direction perpendicular to the lead. Further, FIG. 24 is a data diagram showing crystal orientability of the exterior plating film (after temperature cycle) before improvement shown in FIG. 10 when looking in a horizontal direction with respect to the lead, FIG. 25 is a data diagram showing crystal orientability of the exterior plating film (after temperature cycle) after improvement (this embodiment) shown in FIG. 11 when looking in a horizontal direction with respect to the lead, FIG. 26 is a data diagram showing crystal orientability of the exterior plating film (after temperature cycle) before improvement shown in FIG. 10 when looking in a direction perpendicular to the lead, and FIG. 27 is a data diagram showing crystal orientability of the exterior plating film (after temperature cycle) after improvement (this embodiment) shown in FIG. 11 when looking in a direction perpendicular to the lead.

Figure 29:
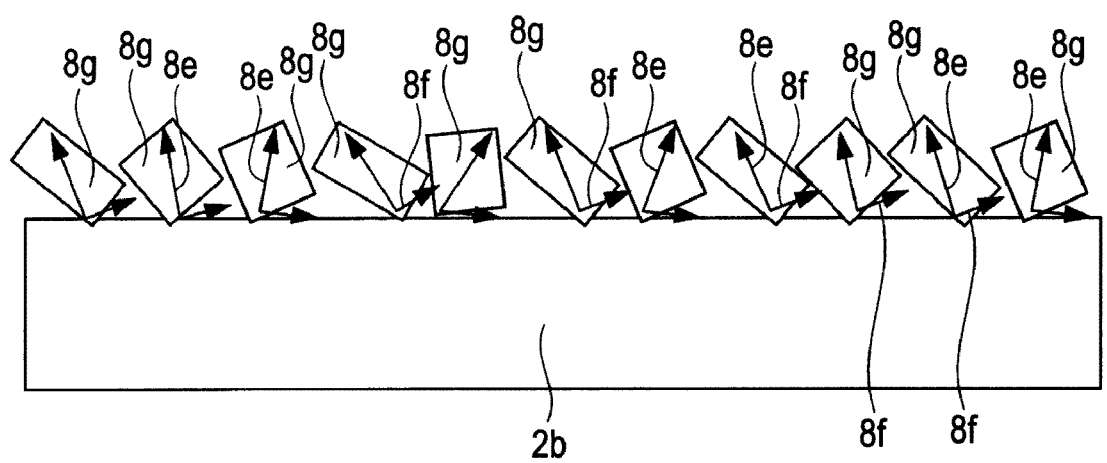
FIG. 29 is a schematic diagram showing a first step of estimated precipitation principles in the exterior plating film after improvement.

FIG. 28 is a data diagram showing a whisker suppressing effect in the exterior plating film after improvement (this embodiment) shown in FIG. 11, FIG. 29 is a schematic diagram showing a first step of estimated precipitation principles in the exterior plating film after improvement, and FIG. 30 is a schematic diagram showing a second step of the estimated precipitation principles in the exterior plating film after improvement.

FIGS. 20 to 27 are all data diagrams showing distribution quantities orientation by orientation based on IPF plotting. In each figure, a white region is a region of distribution quantity "zero (0)" and a region hatched with oblique lines is the highest distribution quantity region.

FIGS. 20 and 21 show analysis results in a horizontal direction with respect to the lead (frame member) after plating. A comparison between the state before improvement in FIG. 20 and the state after improvement in FIG. 21 shows that the orientations which were zero in distribution quantity before improvement (FIG. 20) and were no longer zero (namely, increased) in distribution quantity after improvement (FIG. 21) are (103), (110), (201), (411), (421), (441), (512), (541) and (991).

Thus, by forming an exterior plating film 8 of a structure having such orientability it is possible to suppress the formation of whisker. The orientations which were decreased in distribution quantity after improvement as compared with the distribution quantity before improvement are (111), (210), (323), (332), (432) and (951). A plating structure having such an orientating characteristic exhibits an effect effective for suppressing the formation of tin whisker.

FIGS. 22 and 23 show analysis results in a direction perpendicular to the lead (frame member) after plating. A comparison between the state before improvement in FIG. 22 and the state after improvement in FIG. 23 shows that the orientations which were zero in distribution quantity before improvement (FIG. 22) and were no longer zero (namely, increased) in distribution quantity after improvement (FIG. 23) are (310), (332), (410) and (931).

Thus, by forming an exterior plating film 8 of a structure having such orientability it is possible to suppress the formation of whisker.

Further, the orientation which was decreased in distribution quantity after improvement as compared with the distribution quantity before improvement is (110); besides, there is observed an increase of orientations in the vicinity of (310), (410) and (931). A plating structure having such an orientating characteristic exhibits an effect effective for suppressing the formation of tin whisker.

FIGS. 24 and 25 show analysis results in a horizontal direction with respect to the lead (frame member) after plating and after temperature cycle environmental test in which the growth of tin whisker is marked. A comparison between the state before improvement (FIG. 24) and that after improvement (FIG. 25) shows that the orientations which were zero in distribution quantity before improvement (FIG. 24) and were no longer zero (namely, increased) in distribution quantity after improvement (FIG. 25) are (100), (211), (301), (332), (401), (432), (532) and (910).

Thus, by forming an exterior plating film 8 of a structure having such orientability it is possible to suppress the formation of whisker.

Further, the orientations (103), (210), (320), (413), (431), (441), (521), (541), (631), (951), (971) and (991) decreased during the temperature cycle environmental test, while the orientations (432), (532), (211) and (312) increased during the same test. Thus, a plating structure having such an orientating characteristic exhibits an effect effective for suppressing the formation of tin whisker.

FIGS. 26 and 27 show analysis results in a direction perpendicular to the lead (frame member) after plating and after temperature cycle environmental test in which the growth of tin whisker is marked. A comparison between the state before improvement in FIG. 26 and the state after improvement in FIG. 27 shows that the orientations which were zero in distribution quantity before improvement (FIG. 26) and were no longer zero (namely, increased) in distribution quantity after improvement (FIG. 27) are (111), (211), (312), (332) and (432).

Thus, by forming an exterior plating film 8 of a structure having such orientability it is possible to suppress the formation of whisker.

Further, the orientations (110), (430) and (221) decreased during the temperature cycle environmental test, while the orientations (631), (421), (321), (432), (332), (532) and (211) increased during the same test. A plating structure having such an orientating characteristic exhibits an effect effective for suppressing the formation of tin whisker.

Next, a description will be given below about a method for implementing (forming) a plating structure having the aforesaid characteristics in the exterior plating film 8 such as the aforesaid crystal grain diameter, grain distribution, low average linear expansion coefficient and orientability.

An example of a method for forming the exterior plating film 8 according to this embodiment is to obtain a plural-layer plating film by changing the current density during plating.

According to a concrete example, at a first stage in a plating tank (not shown) having first to fifth stages, a first lead-free plating film (a condition-changed layer) is formed on the lead side (interface side) of the exterior plating film 8 under the conditions of, for example, 30 A/dm$^2$, 10 seconds. Thereafter, at each of the second to fifth stages in the plating tank there is formed a second lead-free plating film on the plating surface side over the first lead-free plating film under the conditions of, for example, 20 A/dm$^2$, 10 seconds. The conditions of 20 A/dm$^2$, 10 seconds are standard conditions in forming a lead-free plating film. In this case, the first lead-free plating film as a condition-changed layer formed on the interface side is formed first at a large current density and is then completed in a short time (10 seconds). The second lead-free plating film using the standard current density (20 A/dm$^2$) is formed slowly over a period of sufficient time (10 seconds×4 times). Thus, by changing the current density during plating it is possible to form the exterior plating film 8 as a two-layer structure.

In case of forming the exterior plating film 8 in this embodiment by adopting the above method, if for example the interface side with the lead is a condition-changed layer, then by forming the first lead-free plating film as the condition-changed layer under such conditions (e.g., current density and application time) as afford the grain layer 8a shown in FIG. 8 in which grains not larger than 1 μm in diameter gather and by subsequently forming thereon a layer of the second lead-free plating film under the standard conditions including current density, it is possible to form the exterior plating film 8 in this embodiment.

However, no limitation is made to the foregoing method of forming a plural-layer plating film by changing the current density during plating. There may be adopted any other method if only the method adopted can implement a plating structure having such characteristics as described in this embodiment in connection with crystal grain diameter and distribution, as well as low average linear expansion coefficient and orientability.

In the conventional dull plating it is presumed that relatively small crystals having the orientation (111) are precipitated and grains of a geometrically large diameter are precipitated thereon. Also in this case, the overlying orientation succeeds to the underlying orientation and crystal grains precipitated are oriented to (111).

In the foregoing method of obtaining a plural-layer plating film by changing the current density during plating, for example in case of changing the conditions near the interface between the lead (frame member) and the exterior plating film 8 by changing the current density, there first occurs the precipitation of crystals 8g small in grain diameter and having random (111) orientation directions 8e. In this case, the C-axis direction 8f becomes a horizontal direction with respect to the outer lead (frame member) 2b and the precipitation of crystals horizontal and large in linear expansion coefficient becomes extinct.

Thereafter, as shown in FIG. 30, crystals 8h small in grain diameter are precipitated in the same manner as described previously over the crystals 8g, but the crystals 8h are oriented in random (111) orientation directions 8e along the underlying orientations. Further, though not shown, crystals of geometric large grain diameters are precipitated also over the crystals 8h. This precipitation of geometric large grain diameter crystals also has random orientations.

Crystallographically, since the orientation (111) is large in linear expansion coefficient, the precipitation having random orientations is considered to be effective in diminishing the linear expansion coefficient.

FIG. 28 shows the results of a whisker test conducted for the exterior plating film 8 in this embodiment. The test results shown therein are of the case where an exterior plating film 8 of a plating structure effective in suppressing the formation of whisker was obtained by the foregoing method of obtaining a plural-layer plating film while changing the current density during plating. Whisker length ratios compared with those before improvement are shown in the figure.

In FIG. 28, the minus (−) indicates a decrease of whisker length. All the values shown in the same figure indicate a decrease of whisker length in comparison with those before improvement. That is, it is seen that the characteristic structure of the exterior plating film 8 obtained in this embodiment is effective in suppressing the growth of whisker.

Given that the linear expansion coefficient of tin is 23 ppm, that of copper is 17 ppm and that of iron-nickel alloy is 5 ppm, there is a linear expansion coefficient difference of 18 ppm between tin and iron-nickel alloy, therefore, in the event of occurrence of a temperature change, strain (stress) becomes large.

However, in the QFP1 of this embodiment, by increasing the percent presence of grains small in diameter (not larger than 1 μm) contained in the exterior plating film 8 formed on the surface of each outer lead 2b and by precipitating crystals having orientations small in linear expansion coefficient, it is possible to decrease the whisker generation potential and thereby improve the whisker resistance. Between tin and copper there is a linear expansion coefficient difference of 6 ppm, but since this difference is relatively small, strain (stress) is small even upon occurrence of a temperature difference, so that the occurrence of whisker does not result.

According to the semiconductor device of this embodiment, in the exterior plating film 8 formed on each outer lead 2b, the number of grains not larger than 1 μm in diameter and present on the interface side 8c closer to the outer lead 2b is larger than that of grains not larger than 1 μm in diameter and present on the surface side 8d, thus resulting in an increase in the number of small-diameter grains on the interface side 8c with the outer lead 2b. Thus, randomness occurs in orientability, with the result that it is possible to diminish the average linear expansion coefficient in the whole of the exterior plating film 8.

Consequently, the difference in linear expansion coefficient between the exterior plating film 8 and the outer lead 2b (frame member) becomes smaller, so that a compressive stress induced by the difference in linear expansion coefficient between the two can be reduced.

Accordingly, the compressive stress imposed on the exterior plating film 8 becomes difficult to be accumulated and hence it is possible to suppress the growth of whisker. As a result, it is possible to improve the whisker resistance in the exterior plating film 8.

Besides, since the whisker resistance in the exterior plating film 8 can be improved, it is possible to diminish the occurrence of malfunction of the semiconductor device (QFP1) caused by an electric short.

Moreover, since the number of small-diameter grains increases in the exterior plating film 8, the migration distance of tin atoms propagated in the grain boundary becomes longer. Consequently, it is possible to suppress tin atoms reaching up to the surface and hence possible to make whisker difficult to occur. Here there is the possibility that a gathered layer of small-diameter grains plays the role of a buffer layer to relieve the stress.

By a synergistic effect of the above points, the growth of whisker in the temperature cycle test environment can be suppressed also in the combination of iron-nickel alloy and lead-free plating, which is disadvantageous to the occurrence of whisker.

Although the present invention has been described above concretely by way of an embodiment thereof, it goes without saying that the present invention is not limited to the above embodiment and that various changes may be made within the scope not departing from the gist of the invention.

For example, although in the above embodiment reference has been made to the case where the semiconductor device is QFP1, the semiconductor device is not specially limited. It may be another type of a semiconductor device if only the semiconductor device concerned has outer leads as external terminals and with an exterior plating film formed on each of the outer leads. For example, the semiconductor device may be SOP (Small Outline Package), QFJ (Quad Flat J-leaded Package), or SOJ (Small Outline J-leaded Package).

INDUSTRIAL APPLICABILITY

The present invention is suitable for assembling an electronic device to be subjected to lead-free plating and can suppress the growth of tin whisker.

What is claimed is:
1. A semiconductor device comprising:
a semiconductor chip having a plurality of surface electrodes;
a die pad with the semiconductor chip mounted thereover;
a plurality of inner leads arranged around the semiconductor chip;

a plurality of wires for coupling the surface electrodes of the semiconductor chip and the inner leads with each other electrically;

a sealing body for sealing the semiconductor chip, the inner leads and the wires;

a plurality of outer leads integrally coupled to the inner leads respectively and exposed from the sealing body; and exterior plating films formed over surfaces of the outer leads respectively, wherein the exterior plating films are each formed so that the number of grains not larger than 1 μm in diameter and present on an interface side closer to the corresponding lead with respect to a center in the thickness direction of the exterior plating film is larger than the number of grains not larger than 1 μm in diameter and present on a surface side of the exterior plating film.

2. A semiconductor device according to claim 1, wherein the outer leads are each formed of iron-nickel alloy or copper alloy.

3. A semiconductor device according to claim 2, wherein the exterior plating films contain tin as a principal component.

4. A semiconductor device according to claim 3, wherein a silver plating film is formed over a wire coupling portion of each of the inner leads.

5. A semiconductor device according to claim 1, wherein the thickness of a grain layer having grains not larger than 1 μm in diameter is one-tenth of the thickness of each of the exterior plating films.

6. A semiconductor device according to claim 1, wherein the exterior plating films each contain 45% or more grains not larger than 1 μm in diameter.

7. A semiconductor device according to claim 1, wherein, in each of the exterior plating films, grains not larger than 1 μm in diameter are present 50% or more at an interface-side position closer to the corresponding lead with respect to the center in the thickness direction of the exterior plating film.

8. A semiconductor device according to claim 1, wherein, in each of the exterior plating films, grains not larger than 1 μm in diameter are present 35% or more at a surface-side position closer to the surface of the exterior plating film with respect to the center in the thickness direction of the exterior plating film.

9. A semiconductor device according to claim 1, wherein, after a temperature cycle environmental test, grains not larger than 1 μm are present 45% or more in each of the exterior plating films.

10. A semiconductor device according to claim 1, wherein the thickness of a layer comprising a plurality of grains not larger than 1 μm in diameter is not smaller than 1.5 μm.

11. A semiconductor device according to claim 1, wherein grains of a plurality of diameters are contained in each of the exterior plating films, and an average sectional area of the diameters' grains is not larger than 2.5 μm².

12. A semiconductor device according to claim 1, wherein grains of a plurality of diameters are contained in each of the exterior plating films, and an average sectional area of the diameters' grains is not larger than 2.4 μm² at a surface-side position closer to the surface of the exterior plating film with respect to the center in the thickness direction of the exterior plating film.

13. A semiconductor device according to claim 1, wherein grains of a plurality of diameters are contained in each of the exterior plating films, and an average sectional area of the diameters' grains is not larger than 1.6 μm² at an interface-side position closer to the corresponding lead with respect to the center in the thickness direction of the exterior plating film.

14. A semiconductor device according to claim 1, wherein grains of a plurality of diameters are contained in each of the exterior plating films, the grains of a plurality of diameters being not larger than 21 ppm in linear expansion coefficient.

15. A semiconductor device according to claim 1, wherein grains of a plurality of diameters are contained in each of the exterior plating films, and a mean value of linear expansion coefficient differences between the diameters' grains in each of the exterior plating films and the corresponding lead is 16.3 ppm or less.

16. A semiconductor device according to claim 1, wherein increased orientations in each of the exterior plating films are (103), (110), (201), (411), (421), (441), (512), (541) and (991) when looking in a horizontal direction with respect to the corresponding lead.

17. A semiconductor device according to claim 1, wherein increased orientations in each of the exterior plating films are (310), (332), (410) and (931) when looking in a direction perpendicular to the corresponding lead.

18. A semiconductor device according to claim 1, wherein increased orientations in each of the exterior plating films are (100), (211), (301), (332), (401), (432), (532) and (910) when looking in a horizontal direction with respect to the corresponding lead after a temperature cycle environmental test.

19. A semiconductor device according to claim 1, wherein increased orientations in each of the exterior plating films are (111), (211), (312), (332) and (432) when looking in a direction perpendicular to the corresponding lead after a temperature cycle environmental test.

20. A semiconductor device according to claim 1, wherein disappeared orientations in each of the exterior plating films are (111), (210), (323), (332), (432) and (951) when looking in a horizontal direction with respect to the corresponding lead.

21. A semiconductor device according to claim 1, wherein a disappeared orientation in each of the exterior plating films is (110) when looking in a direction perpendicular to the corresponding lead.

22. A semiconductor device according to claim 1, wherein disappeared orientations in each of the exterior plating films are (103), (210), (320), (413), (431), (441), (521), (541), (631), (951), (971) and (991) when looking in a horizontal direction with respect to the corresponding lead after a temperature cycle environmental test.

23. A semiconductor device according to claim 1, wherein disappeared orientations in each of the exterior plating films are (110), (221) and (430) when looking in a direction perpendicular to the corresponding lead after a temperature cycle environmental test.

* * * * *